US011640990B2

(12) United States Patent
Lichtenwalner et al.

(10) Patent No.: US 11,640,990 B2
(45) Date of Patent: May 2, 2023

(54) POWER SEMICONDUCTOR DEVICES INCLUDING A TRENCHED GATE AND METHODS OF FORMING SUCH DEVICES

(71) Applicant: Wolfspeed, Inc., Durham, NC (US)

(72) Inventors: Daniel Lichtenwalner, Raleigh, NC (US); Sei-Hyung Ryu, Cary, NC (US); Naeem Islam, Morrisville, NC (US); Woongsun Kim, Cary, NC (US); Matt N. McCain, Raleigh, NC (US); Joe McPherson, Plano, TX (US)

(73) Assignee: Wolfspeed, Inc., Durham, NC (US)

( * ) Notice: Subject to any disclaimer, the term of this patent is extended or adjusted under 35 U.S.C. 154(b) by 136 days.

(21) Appl. No.: 17/080,956

(22) Filed: Oct. 27, 2020

(65) Prior Publication Data

US 2022/0130995 A1  Apr. 28, 2022

(51) Int. Cl.
*H01L 29/78* (2006.01)
*H01L 29/16* (2006.01)
*H01L 29/66* (2006.01)

(52) U.S. Cl.
CPC ...... *H01L 29/7813* (2013.01); *H01L 29/1608* (2013.01); *H01L 29/66727* (2013.01); *H01L 29/66734* (2013.01)

(58) Field of Classification Search
CPC .............. H01L 29/7813; H01L 29/1608; H01L 29/66727; H01L 29/66734
USPC .......................................................... 257/288
See application file for complete search history.

(56) References Cited

U.S. PATENT DOCUMENTS

| 6,097,061 A * | 8/2000 | Liu ................... H01L 29/66621 |
| | | 257/E21.429 |
| 6,342,709 B1 | 1/2002 | Sugawara et al. |
| 9,570,570 B2 | 2/2017 | Lichtenwalner et al. |
| 10,243,038 B1 | 3/2019 | Tanaka et al. |

(Continued)

FOREIGN PATENT DOCUMENTS

| CN | 106910774 A | 6/2017 |
| EP | 0666590 A2 | 8/1995 |
| KR | 20110064431 A | 6/2011 |

OTHER PUBLICATIONS

"Notification of Transmittal of the International Search Report and the Written Opinion of the International Searching Authority, or the Declaration for corresponding International Application No. PCT/US2021/055766, dated Feb. 7, 2022, (16 pages)".

*Primary Examiner* — Igwe U Anya
(74) *Attorney, Agent, or Firm* — Myers Bigel, P.A.

(57) ABSTRACT

Semiconductor devices and methods of forming the devices are provided. Semiconductor devices include a semiconductor layer structure comprising a trench in an upper surface thereof, a dielectric layer in a lower portion of the trench, and a gate electrode in the trench and on the dielectric layer opposite the semiconductor layer structure. The trench may include rounded upper corner and a rounded lower corner. A center portion of a top surface of the dielectric layer may be curved, and the dielectric layer may be on opposed sidewalls of the trench. The dielectric layer may include a bottom dielectric layer on a bottom surface of the trench and on lower portions of the sidewalls of the trench and a gate dielectric layer on upper portions of the sidewalls of the trench and on the bottom dielectric layer.

24 Claims, 30 Drawing Sheets

(56) References Cited

U.S. PATENT DOCUMENTS

| | | | |
|---|---|---|---|
| 2008/0048258 A1* | 2/2008 | de Fresart | H01L 29/7397 |
| | | | 257/E29.174 |
| 2010/0059816 A1 | 3/2010 | Shimada et al. | |
| 2016/0163852 A1* | 6/2016 | Siemieniec | H01L 29/045 |
| | | | 438/237 |
| 2018/0040694 A1* | 2/2018 | Tseng | H01L 29/66795 |
| 2018/0097102 A1* | 4/2018 | Baba | H01L 29/1608 |

* cited by examiner

POWER SEMICONDUCTOR DEVICES INCLUDING A TRENCHED GATE AND METHODS OF FORMING SUCH DEVICES

FIELD

The present invention relates to semiconductor devices and, more particularly, to power semiconductor devices including a trenched gate.

BACKGROUND

The Metal Insulating Semiconductor Field Effect Transistor ("MISFET") is a well-known type of semiconductor transistor that may be used as a switching device. A MISFET is a three terminal device that has gate, drain and source terminals and a semiconductor body. A source region and a drain region are formed in the semiconductor body that are separated by a channel region, and a gate electrode (which may act as the gate terminal or be electrically connected to the gate terminal) is separated from the channel region by a thin insulating layer that is referred to as a "gate dielectric layer." A MISFET may be turned on or off by applying a bias voltage to the gate electrode. When a MISFET is turned on (i.e., it is in its "on-state"), current is conducted through the channel region of the MISFET between the source region and drain region. When the bias voltage is removed from the gate electrode (or reduced below a threshold level), the current ceases to conduct through the channel region. By way of example, an n-type MISFET has n-type source and drain regions and a p-type channel.

In most cases, the gate dielectric layer that separates the gate electrode of a power MISFET from the channel region is implemented as a thin oxide layer (e.g., a silicon oxide layer). A MISFET that has an oxide gate dielectric layer is referred to as a Metal Oxide Semiconductor Field Effect Transistor ("MOSFET"). As oxide-based gate dielectric layers are almost always used due to their superior properties, the discussion herein will focus on MOSFETs as opposed to MISFETs, but it will be appreciated that the techniques according to embodiments of the present invention that are described herein are equally applicable to devices having gate dielectric layers formed with materials other than oxides.

Because the gate electrode of a MOSFET is insulated from the channel region by the gate dielectric layer, minimal gate current is required to maintain the MOSFET in its on-state or to switch a MOSFET between its on-state and its off-state. The gate current is kept small during switching because the gate forms a capacitor with the channel region. Thus, only minimal charging and discharging current is required during switching, allowing for less complex gate drive circuitry and faster switching speeds. MOSFETs may be stand-alone devices or may be combined with other circuit devices. For example, an Insulated Gate Bipolar Transistor ("IGBT") is a semiconductor device that includes both a MOSFET and a Bipolar Junction Transistor ("BJT") that combines the high impedance gate electrode of the MOSFET with small on-state conduction losses that may be provided by a BJT. An IGBT may be implemented, for example, as a Darlington pair that includes a high voltage n-channel MOSFET at the input and a BJT at the output. The base current of the BJT is supplied through the channel of the MOSFET, thereby allowing a simplified external drive circuit (since the drive circuit only charges and discharges the gate electrode of the MOSFET).

In some applications, MOSFETs may need to carry large currents in their on-state and/or be capable of blocking high voltages (e.g., thousands of volts) in their reverse blocking state. Such MOSFETs are often referred to as "power" MOSFETs. Power MOSFETs and power IGBTs are often fabricated from wide band-gap semiconductor materials, such as silicon carbide ("SiC") or gallium nitride ("GaN") based semiconductor materials. Herein, a wide band-gap semiconductor material refers to a semiconductor material having a band-gap greater than 1.40 eV.

A conventional power semiconductor device typically has a semiconductor substrate, such as a silicon carbide substrate having a first conductivity type (e.g., an n-type substrate), on which an epitaxial layer structure having the first conductivity type (e.g., n-type) is formed. A portion of this epitaxial layer structure (which may comprise one or more separate layers) functions as a drift region of the power semiconductor device. The power semiconductor device typically includes an active region that may be formed on and/or in the drift region. The active region acts as a main junction for blocking voltage in the reverse bias direction and providing current flow in the forward bias direction. One or more power semiconductor devices may be formed on the substrate. After the substrate is fully processed, the resultant structure may be diced to separate the individual power semiconductor devices. The power semiconductor devices may have a unit cell structure in which the active region of each power semiconductor device includes a plurality of individual "unit cell" devices that are disposed in parallel to each other and that together function as a single power semiconductor device.

Power semiconductor devices can have a lateral structure or a vertical structure. In a device having a lateral structure, the terminals of the device (e.g., the drain, gate and source terminals for a power MOSFET device) are on the same major surface (i.e., top or bottom) of a semiconductor layer structure. In contrast, in a device having a vertical structure, at least one terminal is provided on each major surface of the semiconductor layer structure (e.g., in a vertical MOSFET device, the source may be on the top surface of the semiconductor layer structure and the drain may be on the bottom surface of the semiconductor layer structure). The semiconductor layer structure may or may not include an underlying substrate. Herein, the term "semiconductor layer structure" refers to a structure that includes one or more semiconductor layers, such as semiconductor substrates and/or semiconductor epitaxial layers.

Vertical power semiconductor devices that include a MOSFET transistor can have a standard gate electrode design in which the gate electrode of the transistor is formed on top of the semiconductor layer structure or, alternatively, may have the gate electrode buried in a trench within the semiconductor layer structure. A gate electrode buried in a trench is typically referred to as a trenched gate, and a MOSFET that includes a trenched gate is often referred to as a U-Shaped MOSFET (UMOSFET). The UMOSFET includes a channel vertically disposed and provides enhanced performance.

One failure mechanism for a power UMOSFET is so-called "breakdown" of the gate oxide layer. When power UMOSFETs are in their conducting or "on" state, all portions of the gate oxide layer are subjected to high electric fields. Likewise, when power UMOSFETs are in their reverse blocking or "off" state, the lower portion of the gate oxide layer is similarly subjected to high electric fields. The stress on the gate oxide layer caused by these high electric fields generates defects in the oxide material that build up over time. When the concentration of defects reaches a critical value, a so-called "percolation path" may be created through the gate oxide layer that electrically connects the gate electrode to the semiconductor layer structure, thereby creating a short-circuit that can destroy the device. The "lifetime" of a gate oxide layer (i.e., how long the device can be operated before breakdown occurs) is a function of, among other things, the magnitude of the electric field that the gate oxide layer is subjected to and the length of time for which the electric field is applied. FIG. 1 is a schematic graph illustrating the relationship between the operating time until breakdown occurs (the "gate oxide lifetime") and the level of the electric field applied to the gate oxide layer. This graph assumes that the same electric field is always applied (which is not necessarily the case), and assumes a gate oxide layer having a certain thickness. As shown in FIG. 1, the relationship may, in some cases, be generally linear when the gate oxide lifetime is plotted on a logarithmic scale. The important point to take from FIG. 1 is that as the electric field level is increased, the lifetime of the gate oxide layer decreases exponentially. The lifetime of the gate oxide layer may be increased by increasing the thickness of the gate oxide layer, but the performance of the MOSFET also is a function of the thickness of the gate oxide layer and thus increasing the thickness of the gate oxide layer is typically not an acceptable way of increasing the lifetime of the gate oxide layer.

SUMMARY

Pursuant to embodiments of the present invention, semiconductor devices are provided that include a semiconductor layer structure comprising a trench in an upper surface thereof, where the trench comprises a rounded upper corner and a rounded lower corner, a dielectric layer in a lower portion of the trench, where a center portion of a top surface of the dielectric layer is curved, and the dielectric layer is on opposed sidewalls of the trench, and a gate electrode in the trench and on the dielectric layer opposite the semiconductor layer structure.

In some embodiments, the dielectric layer may comprise a bottom dielectric layer on a bottom surface of the trench and on lower portions of the sidewalls of the trench, and a gate dielectric layer on upper portions of the sidewalls of the trench and on the bottom dielectric layer, where the center portion of the top surface of the dielectric layer that is curved may be a center portion of a top surface of the gate dielectric layer.

In some embodiments, the center portion of the top surface of the dielectric layer that is curved may have a radius of curvature between 0.25 times the smaller of a width and a depth of the trench and 3 times the larger of the width and the depth of the trench.

Pursuant to embodiments of the present invention, semiconductor devices are provided that include a semiconductor layer structure comprising a trench in an upper surface thereof, where the trench comprises a rounded upper corner and a rounded lower corner, a bottom dielectric layer in a lower portion of the trench, a gate dielectric layer on a sidewall of the trench and on the bottom dielectric layer, and a gate electrode in the trench and on the gate dielectric layer opposite the semiconductor layer structure, where the bottom dielectric layer comprises a first concentration of an additive, and the gate dielectric layer has a second concentration of the additive that is lower than the first concentration.

Pursuant to embodiments of the present invention, semiconductor devices are provided that include a semiconductor layer structure comprising a trench in an upper surface thereof, where the trench comprises a rounded upper corner and a rounded lower corner, a bottom dielectric layer in a lower portion of the trench, a gate dielectric layer on a sidewall of the trench and on the bottom dielectric layer, the gate dielectric layer comprising a material different from the bottom dielectric layer, and a gate electrode in the trench and on the gate dielectric layer opposite the semiconductor layer structure.

Pursuant to embodiments of the present invention, semiconductor devices are provided that include a semiconductor layer structure comprising a trench in an upper surface thereof, where the trench comprises a rounded upper corner and a rounded lower corner, a bottom dielectric layer in a lower portion of the trench, a gate dielectric layer on a sidewall of the trench and on the bottom dielectric layer, a barrier layer between the bottom dielectric layer and the gate dielectric layer, and a gate electrode in the trench and on the gate dielectric layer opposite the semiconductor layer structure.

In some embodiments, a center portion of a lower surface of the gate dielectric layer may be curved and may have a radius of curvature between 0.25 times the smaller of a width and a depth of the trench and 3 times the larger of the width and the depth of the trench in any of the semiconductor devices, or between 0.5 times the smaller of the width/depth of the trench and 2 times the larger of the width/depth of the trench, or between 0.75 times the smaller of the width/depth of the trench and 1.5 times the larger of the width/depth of the trench. The center portion of the lower surface of the gate dielectric layer refers to the portion of the lower surface of the gate dielectric layer that extends in the width direction of the trench from a center of the trench to halfway to each of the sidewalls of the trench.

In some embodiments, the gate dielectric layer of any of the semiconductor devices may comprise a material different from the bottom dielectric layer.

In some embodiments, the bottom dielectric layer of any of the semiconductor devices may comprise a spin-on-glass layer.

In some embodiments, the bottom dielectric layer of any of the semiconductor devices may comprise an additive comprising boron (B), phosphorous (P), sodium (Na), potassium (K), lithium (Li), calcium (Ca), magnesium (Mg), and/or lead (Pb).

In some embodiments, the gate dielectric layer of any of the semiconductor devices may comprise the additive of the bottom dielectric layer.

In some embodiments, the gate dielectric layer of any of the semiconductor devices may comprise an impurity that is different from the additive of the bottom dielectric layer.

In some embodiments, any of the semiconductor devices may further comprise a barrier layer between the bottom dielectric layer and the gate dielectric layer.

In some embodiments, the semiconductor layer structure of any of the semiconductor devices may comprise a drift layer having a first conductivity type, a well having a second conductivity type in an upper portion of the drift layer and a source region having the first conductivity type in an upper portion of the well, and where an uppermost end of the barrier layer may be closer to the bottom surface of the trench than a bottom surface of the well.

In some embodiments, the barrier layer of any of the semiconductor devices may comprise a silicon nitride layer and/or a silicon oxide layer.

In some embodiments, the gate dielectric layer of any of the semiconductor devices may comprise a first portion on the bottom dielectric layer and a second portion on the sidewall of the trench, where a center portion of the bottom dielectric layer may have a first thickness in a depth direction of the trench, the first portion of the gate dielectric layer may have a second thickness in the depth direction of the trench, the second portion of the gate dielectric layer may have a third thickness in a width direction of the trench, and a sum of the first thickness and the second thickness may be greater than the third thickness.

In some embodiments, the first thickness may be in a range of from 2 nanometers to 90 nanometers.

In some embodiments, the third thickness may be in a range of from 10 nanometers to 90 nanometers.

In some embodiments, a depth of the trench may be at least 1.5 times the sum of the first thickness and the second thickness.

In some embodiments, the sum of the first thickness and the second thickness is greater than the third thickness.

In some embodiments, the second thickness may be within 10% of the third thickness.

In some embodiments, the sum of the first thickness and the second thickness may be greater than the third thickness.

In some embodiments, the bottom dielectric layer in any of the semiconductor devices may be a reflowed dielectric layer.

In some embodiments, the bottom dielectric layer in any of the semiconductor devices may be a spin-on-glass material.

In some embodiments, the semiconductor layer structure of any of the semiconductor devices may comprise 4H-silicon carbide, and a top surface of the semiconductor layer structure may comprise the (0001) face of the 4H-silicon carbide.

In some embodiments, the semiconductor layer structure of any of the semiconductor devices may comprise silicon carbide or silicon, and the dielectric layer of any of the semiconductor devices may comprise silicon oxide.

In some embodiments, the dielectric layer of any of the semiconductor devices may be a reflowed dielectric layer, and the reflowed dielectric layer may comprise a portion on the sidewall of the trench, and a thickness of the portion of the reflowed dielectric layer increases with a depth of the trench.

In some embodiments, the dielectric layer of any of the semiconductor devices may comprise an additive comprising boron (B), phosphorous (P), sodium (Na), potassium (K), lithium (Li), calcium (Ca), magnesium (Mg), and/or lead (Pb).

In some embodiments, a center portion of a bottom surface of the trench may be curved in any of the semiconductor devices.

In some embodiments, each of the rounded upper corner and the rounded lower corner, in any of the semiconductor devices may have a radius of curvature in a range of 0.01 microns to 0.5 microns.

In some embodiments, an opening of the trench may have a first width, and a bottom surface of the trench may have a second width that is narrower than the first width in any of the semiconductor devices.

In some embodiments, the semiconductor layer structure of any of the semiconductor devices may comprise a drift layer having a first conductivity type, a well having a second conductivity type in an upper portion of the drift layer and a source region having the first conductivity type in an upper portion of the well, where the trench may extend through the well, and the drift layer may define a bottom surface of the trench.

In some embodiments, the semiconductor layer structure of any of the semiconductor devices may further comprise a shield region that has the second conductivity type and is in the drift layer.

In some embodiments, the semiconductor layer structure of any of the semiconductor devices may further comprise a source contact that is electrically connected to the source region and is spaced apart from the trench.

In some embodiments, any of the semiconductor devices may be a Metal Insulator Semiconductor Field Effect Transistor ("MISFET") or an insulated Gate Bipolar Transistor ("IGBT").

Pursuant to embodiments of the present invention, methods of forming a semiconductor device are provided. The methods may include forming a trench in a semiconductor substrate, forming a bottom dielectric layer in the trench, where forming the bottom dielectric layer may comprise forming and annealing a preliminary bottom dielectric layer, and preliminary bottom dielectric layer reflowing during annealing, and forming a gate electrode in the trench on the bottom dielectric layer.

Pursuant to embodiments of the present invention, methods of forming a semiconductor device are provided. The methods may include forming a trench in a semiconductor substrate, forming a bottom dielectric layer in the trench, where forming the bottom dielectric layer may comprise forming and annealing a preliminary bottom dielectric layer, and where the preliminary bottom dielectric layer may be annealed at a temperature of at least about a glass transition temperature of the preliminary bottom dielectric layer, and forming a gate electrode in the trench on the bottom dielectric layer.

Pursuant to embodiments of the present invention, methods of forming a semiconductor device are provided. The methods may include forming a trench in a semiconductor substrate, forming a bottom dielectric layer in the trench, where the bottom dielectric layer may comprise boron (B), phosphorous (P), sodium (Na), potassium (K), lithium (Li), calcium (Ca), magnesium (Mg), and/or lead (Pb), forming a gate dielectric layer on the bottom dielectric layer, where the gate dielectric layer may contact an upper portion of a sidewall of the trench and comprising a first material different from the bottom dielectric layer, and then forming a gate electrode in the trench on the bottom dielectric layer.

Pursuant to embodiments of the present invention, methods of forming a semiconductor device are provided. The methods may include forming a trench in a semiconductor substrate, forming a bottom dielectric layer in the trench, where forming the bottom dielectric layer may comprise forming a spin-on-glass layer and then performing an oxidation process, forming a gate dielectric layer on the bottom dielectric layer, where the gate dielectric layer may comprise a first material different from the bottom dielectric layer, and then forming a gate electrode in the trench on the bottom dielectric layer.

In some embodiments, annealing the preliminary bottom dielectric layer may be performed at a temperature at least about a glass transition temperature of the preliminary bottom dielectric layer in any of the methods.

In some embodiments, the preliminary bottom dielectric layer of any of the methods may be formed and annealed concurrently.

In some embodiments, forming and annealing the preliminary bottom dielectric layer may comprise oxidizing the semiconductor substrate in any of the methods.

In some embodiments, oxidizing the semiconductor substrate may comprise performing a thermal oxidation using $O_2$, $O_3$ and/or NO as oxidant or performing a plasma oxidation using $N_2O$ as oxidant in any of the methods.

In some embodiments, oxidizing the semiconductor substrate may be performed in an environment including a network modifier, and the network modifier comprises boron (B), phosphorous (P), sodium (Na), potassium (K), lithium (Li), calcium (Ca), magnesium (Mg), and/or lead (Pb) in any of the methods.

In some embodiments, the preliminary bottom dielectric layer of any of the methods may comprise the network modifier.

In some embodiments, the preliminary bottom dielectric layer of any of the methods may comprise the network modifier in an amount of less than 4% by weight of the preliminary bottom dielectric layer.

In some embodiments, forming the preliminary bottom dielectric layer may comprise forming a spin-on-glass layer, and annealing the preliminary bottom dielectric layer may be performed after forming the spin-on-glass layer in any of the methods.

In some embodiments, the spin-on-glass layer of any of the methods may comprise boron (B), phosphorous (P), sodium (Na), potassium (K), lithium (Li), calcium (Ca), magnesium (Mg), and/or lead (Pb).

In some embodiments, the spin-on-glass layer of any of the methods may comprise an undoped silicon oxide layer.

In some embodiments, forming the preliminary bottom dielectric layer may comprise depositing the preliminary bottom dielectric layer in any of the methods.

In some embodiments, any of the methods may further comprise planarizing the preliminary bottom dielectric layer after depositing the preliminary bottom dielectric layer and before annealing the preliminary bottom dielectric layer.

In some embodiments, any of the methods may further comprise forming a barrier layer on the bottom dielectric layer before forming the gate electrode, and the barrier layer may comprise a first material different from the bottom dielectric layer.

In some embodiments, the barrier layer of any of the methods may comprise a silicon nitride layer and/or a silicon oxide layer.

In some embodiments, the gate electrode of any of the methods may contact an upper surface of the barrier layer.

In some embodiments, any of the methods may further comprise forming a gate dielectric layer on the barrier layer before forming the gate electrode, and the gate dielectric layer may comprise a second material different from the barrier layer.

In some embodiments, any of the methods may further comprise a gate dielectric layer on the bottom dielectric layer before forming the gate electrode, and the gate dielectric layer may comprise a material different from the bottom dielectric layer.

In some embodiments, the gate electrode of any of the methods may contact an upper surface of the bottom dielectric layer.

In some embodiments, any of the methods may further comprise forming a semiconductor layer structure in the semiconductor substrate, where the semiconductor layer structure may comprise a drift layer having a first conductivity type, a well having a second conductivity type in an upper portion of the drift layer and a source region having the first conductivity type in an upper portion of the well.

In some embodiments, any of the methods may further comprise forming a source trench that may be in the semiconductor layer structure and may be spaced apart from the trench, and forming a source contact in the source trench.

In some embodiments, any of the methods may further comprise forming a first shield region in the drift layer underneath the source trench.

In some embodiments, any of the methods may further comprise forming a thin dielectric layer in the trench, and after forming the thin dielectric layer, forming a shield region in the drift layer underneath the trench by implanting an impurity element into a portion of the in the drift layer, where the bottom dielectric layer may be formed after the shield region is formed.

In some embodiments, forming the thin dielectric layer may comprise oxidizing the semiconductor substrate or forming a spin-on-glass layer in any of the methods.

In some embodiments, the preliminary bottom dielectric layer of any of the methods may comprise silicon oxide, and annealing the preliminary bottom dielectric layer may be performed at a temperature of at least about 1300° C. in any of the methods.

In some embodiments, the semiconductor substrate of any of the methods may comprise silicon carbide.

In some embodiments, the semiconductor substrate of any of the methods may comprise comprises 4H-silicon carbide, and a top surface of the semiconductor substrate may comprise the (0001) face of the 4H-silicon carbide.

In some embodiments, forming the bottom dielectric layer may further comprise etching an upper portion of the preliminary bottom dielectric layer until an upper surface of the semiconductor substrate is exposed in any of the methods.

In some embodiments, forming the bottom dielectric layer may further comprise planarizing the preliminary bottom dielectric layer in any of the methods.

DETAILED DESCRIPTION

Pursuant to embodiments of the present invention, power UMOSFETs including a gate dielectric layer having an increased lifetime are provided. The lifetime of the gate dielectric layer may be increased by reducing the strength of the electric field that is applied to the gate dielectric layer during, for example, reverse blocking operation. In some embodiments, the electric field strength applied to the gate dielectric layer may be reduced by rounding corners of a gate trench and/or adding a bottom dielectric layer in a lower portion of the gate trench. In some embodiments, the gate dielectric layer and the bottom dielectric layer may include different materials. In some embodiments, the bottom dielectric layer may include additives (e.g., network modifiers), and the gate dielectric layer may be substantially devoid of these additives. In some embodiments, the gate dielectric layer may include those additives of the bottom dielectric layer diffused from the bottom dielectric layer. In such embodiments, an additive concentration of the gate dielectric layer may be lower than an additive concentration of the bottom dielectric layer. In some embodiments, the gate dielectric layer may include impurities that are different from the additives of the bottom dielectric layer. The gate dielectric layer and the bottom dielectric layer may be collectively referred to as a dielectric layer, and a center portion of a top surface of the dielectric layer may be curved.

Figure 1:
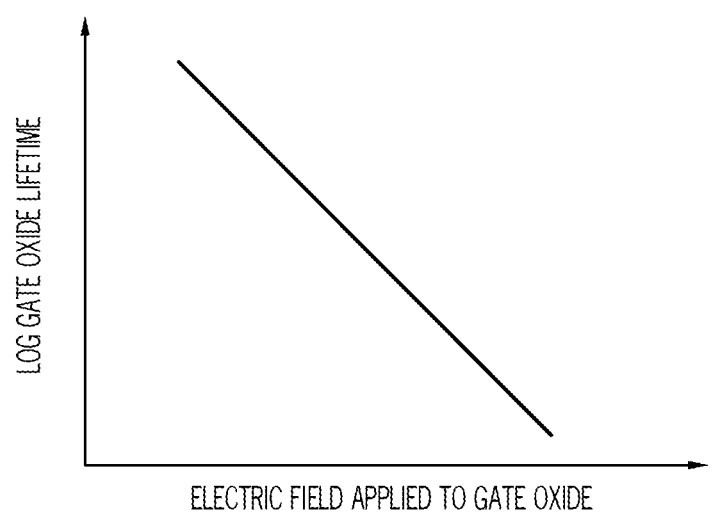
FIG. 1 is a graph illustrating the relationship between the lifetime of the gate dielectric layer as a function of applied electric field strength.
Figure 2:
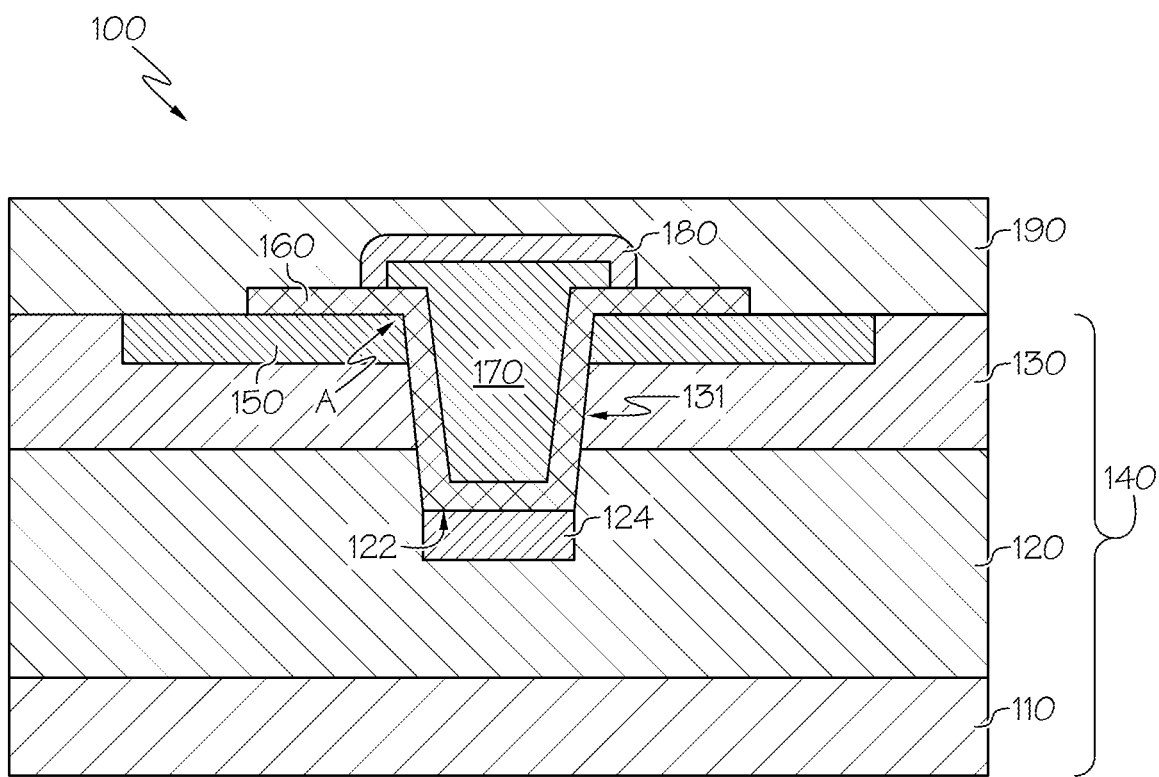
FIG. 2 is a schematic cross-sectional view of a power UMOSFET of related art.

FIG. 2 is a schematic cross-sectional view of a conventional power UMOSFET 100. As shown in FIG. 2, the power UMOSFET 100 includes an n-type semiconductor substrate 110. The semiconductor substrate 110 may comprise, for example, a single crystal 4H silicon carbide semiconductor substrate that is heavily-doped with n-type impurities (i.e., an n+ silicon carbide substrate). A lightly-doped n-type (n−) silicon carbide drift layer 120 is provided on the substrate 110. Upper portions of the n-type silicon carbide drift layer 120 may be doped p-type by, for example, ion implantation, to form silicon carbide p-wells 130. Heavily-doped (n+) n-type silicon carbide regions 150 may be formed in upper portions of the silicon carbide p-wells 130. The n-type silicon carbide regions 150 may be formed by ion implantation. The heavily-doped (n+) n-type silicon carbide regions 150 act as source regions for the device 100. The drift layer 120 and the substrate 110 together act as a common drain region for the device 100. The n-type substrate 110, the n-type drift layer 120, the p-wells 130, and the n-type source regions 150 formed therein may together comprise a semiconductor layer structure 140 of the device 100.

A trench 122 is provided in the drift layer 120. A bottom surface of the trench 122 extends into the drift layer 120 below a bottom surface of the wells 130. A gate dielectric layer 160 is provided on a bottom surface and sidewalls of the trench 122 and on the source regions 150. The gate dielectric layer 160 may include, for example, a silicon oxide ($SiO_2$) layer. P-type shield regions 124 may be formed in the drift layer 120 underneath the gate trench 122. The shield regions 124 may help protect the lower corners of the final gate dielectric layer 160 from high electric fields during reverse blocking operation.

A gate electrode 170 is formed within the trench 122 on the gate dielectric layer 160 opposite the semiconductor layer structure 140. The gate electrode 170 may include, for example, a silicide (e.g., NiSi, TiSi, WSi, CoSi), doped polycrystalline silicon (poly-Si), and/or a stable conductor. Other suitable materials for the gate electrode 170 include various metals such as Ti, Ta or W or metal nitrides such as TiN, TaN or WN. Channel regions 131 are provided in the p-well 130 adjacent sidewalls of the trench 122 between the source region 150 and the drift layer 120.

A dielectric isolation pattern 180 is formed on the gate dielectric layer 160 and the gate electrode 170, and source metallization 190 is formed on the semiconductor layer structure 140, gate dielectric layer 160 and dielectric isolation pattern 180. A drain contact (not shown) may be provided on the lower surface of the substrate 110 opposite the drift layer 120.

It will be appreciated that the above description is of an n-type MOSFET. In p-type devices, the locations of the source and drain contacts may be reversed, and the conductivity types of the other n- and p-type regions may be swapped. All of the embodiments disclosed herein may be implemented either as n-type or as p-type devices.

As discussed above, when the UMOSFET 100 is in its conducting or on-state, the gate dielectric layer 160 is subjected to high electric fields. The strength of this electric field may be particularly high in portions of the gate dielectric layer 160 contacting upper corners A of the trench 122 as the upper corners A of the trench 122 are sharp. Accordingly, the portions of the gate dielectric layer 160 contacting upper corners A of the trench 122 will typically first experience breakdown.

Further, when the UMOSFET 100 is in the blocking state, leakage current may flow through the device as the gate electrode 170 is electrically isolated from the n-type silicon carbide drift layer 120 by only the thin gate dielectric layer 160.

Pursuant to embodiments of the present invention, power semiconductor devices are provided that include a gate trench have rounded upper and/or lower corners. When a gate oxide layer has sharp corner regions, electric field crowding effects tend to significantly increase the magnitude of the electric fields in the gate dielectric layer at these corner regions. For example, the electric field values in a sharp corner region of a gate dielectric layer may be five times greater than the electric field values just outside the corner region. The rounded corners of the gate trench will reduce electric field in portions of a gate dielectric layer contacting these rounded corners during both on-state (primarily for the upper corners) and off-state (primarily for the lower corners) operation. Thus, by rounding the corners of the gate trench, the lifetime of the gate dielectric layer may be increased. Further, pursuant to embodiments of the present invention, power semiconductor devices are provided that include a thick bottom dielectric layer in a lower portion of a gate trench. The thick bottom dielectric layer will reduce electric field in the devices in the blocking state and leakage current of the devices in the blocking state will be reduced.

Figure 3:
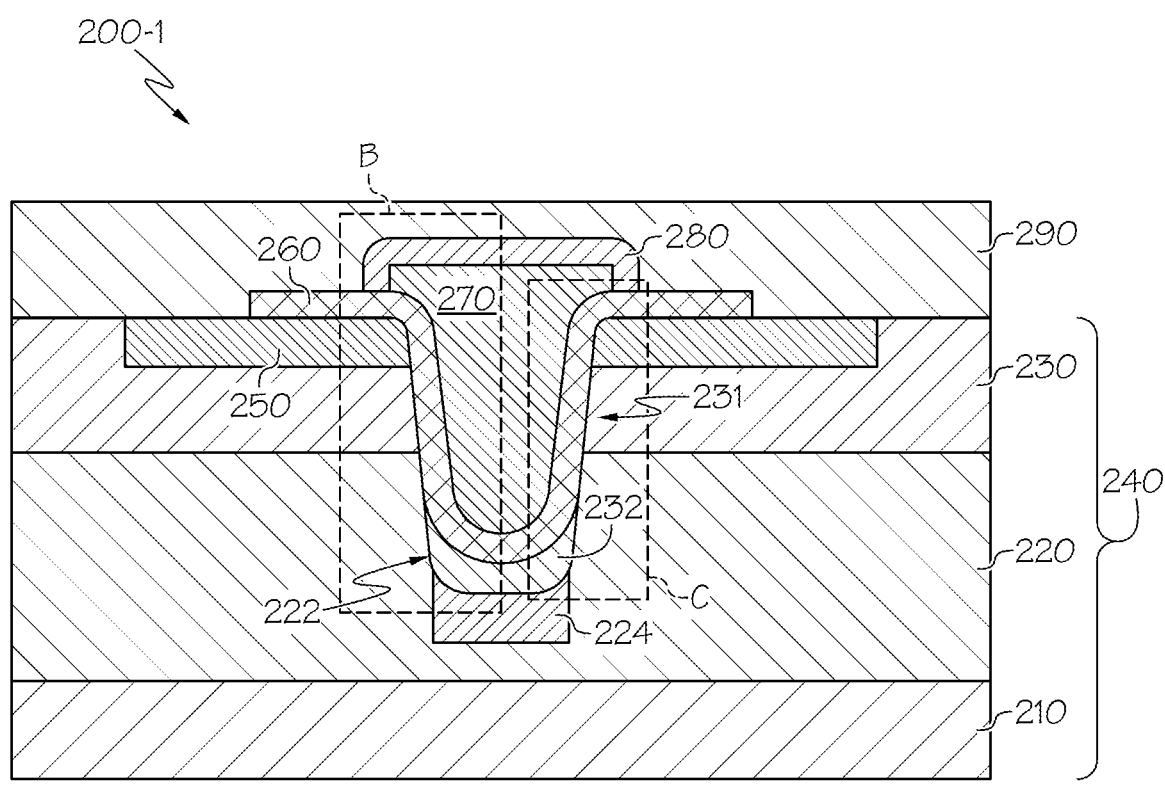
FIG. 3 is a schematic cross-sectional view of a power UMOSFET according to embodiments of the present invention.

FIG. 3 is a schematic cross-sectional view of a power UMOSFET 200-1 according to embodiments of the present invention. The power UMOSFET 200-1 includes a semiconductor layer structure 240 that includes a heavily-doped n-type silicon carbide semiconductor substrate 210, a lightly-doped n-type (n−) silicon carbide drift layer 220, silicon carbide p-type wells 230 and heavily-doped (n+) n-type silicon carbide source regions 250. A trench 222 is provided in the drift layer 220. A bottom surface of the trench 222 may extend into the drift layer 220 below a bottom surface of the p-type wells 230. An opening of the trench 222 has width wider than a width of the bottom surface of the trench 222. A p-type shield region 224 may be formed in the drift layer 220 underneath the trench 222. The shield region 224 may help protect lower corners of a final gate dielectric layer 160 (discussed below) from high electric fields during reverse blocking operation. The discussion herein will focus on a silicon carbide semiconductor substrate, but it will be appreciated that the techniques according to embodiments of the present invention that are described herein are equally applicable to devices including a silicon semiconductor substrate or some other substrate.

A gate dielectric layer 260 is provided on sidewalls of the trench 222 and on the source regions 250. A gate electrode 270 is formed within the trench 222 on the gate dielectric layer 260 opposite the semiconductor layer structure 240. A dielectric isolation pattern 280 is formed on the gate dielectric layer 260 and the gate electrode 270, and source metallization 290 is formed on the semiconductor layer structure 240, gate dielectric layer 260 and dielectric isolation pattern 280. A drain contact (not shown) may be provided on the lower surface of the substrate 210 opposite the drift layer 220.

Region/layers of UMOSFET 200-1 of FIG. 3 may be substantially identical to the corresponding regions/layers of the UMOSFET 100 of FIG. 2, with two exceptions. First, the trench 222 includes rounded upper corners. In some embodiments, lower corners of the trench 222 may also be rounded corners. Second, a bottom dielectric layer 232 may be provided in a lower portion of the trench between the gate dielectric layer 260 and the bottom surface of the trench 222.

Figure 3A:
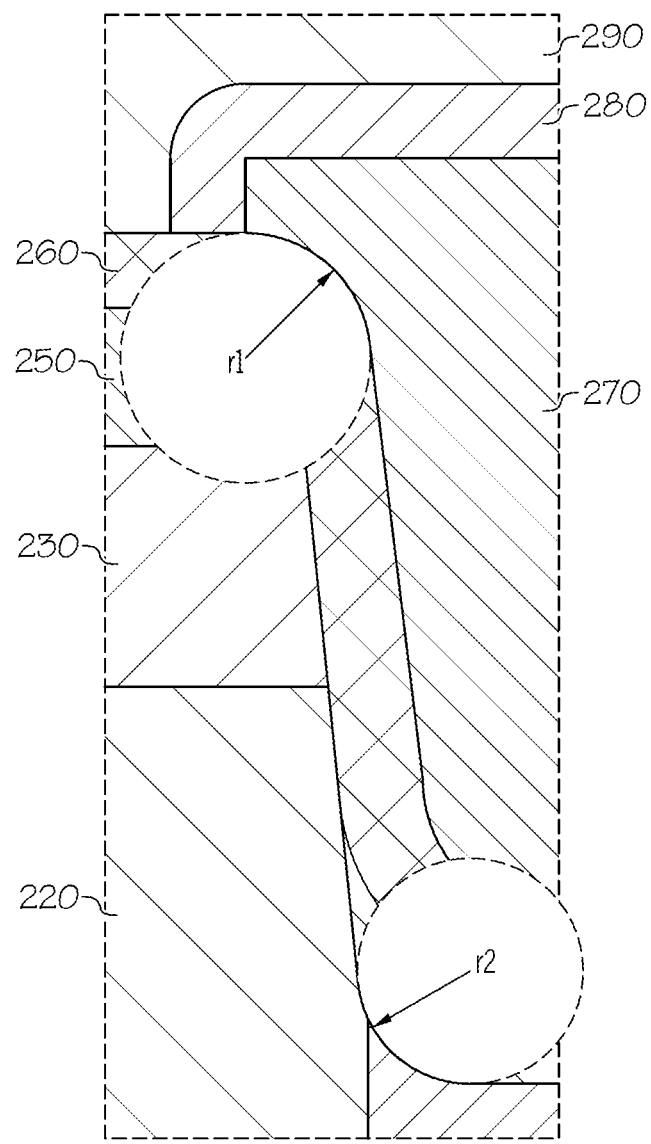
FIG. 3A is an enlarged view of the region B of FIG. 2.

FIG. 3A is an enlarged view of the region B of FIG. 3. As shown in FIG. 3A, the upper corner of the trench 222 may be defined by the source region 250 and may be a rounded corner. For example, the rounded upper corner of the trench 222 may have a first radius r1 of curvature in a range of 0.01 microns to 0.5 microns. The lower corner of the trench 222 may be defined by the drift layer 220 and may be a rounded corner. For example, the rounded lower corner of the trench 222 may have a second radius r2 of curvature in a range of 0.01 microns to 0.5 microns. In some embodiments, either or both of the first radius r1 of curvature and/or the second radius r2 of curvature may be in a range of 0.05 microns to 0.4 microns, in a range of 0.1 microns to 0.45 microns, in a range of 0.2 microns to 0.4 microns or in a range of 0.25 microns to 0.4 microns. In other embodiments, either or both the first radius r1 of curvature and/or the second radius r2 of curvature may be in a range of 0.01 microns to 0.1 microns, in a range of 0.1 microns to 0.2 microns, in a range of 0.2 microns to 0.3 microns, in a range of 0.3 microns to 0.4 microns, or in a range of 0.4 microns to 0.6 microns.

The rounded upper corner of the trench 222 may reduce the magnitude of the electric field applied to portions of the dielectric layer 260, which contact the rounded upper corner, and the lifetime of the gate dielectric layer will increase.

The bottom dielectric layer 232 may include a material different from the gate dielectric layer 260. The bottom dielectric layer 232 may include an insulating material, such as silicon oxide or a spin-on-glass layer, and may further include an additive (e.g., a network modifier), such as boron (B), phosphorous (P), sodium (Na), potassium (K), lithium (Li), calcium (Ca), magnesium (Mg), and/or lead (Pb) in some embodiments. The gate dielectric layer 260 may not include the additive or may have a low concentration of the additive diffused from the bottom dielectric layer 232. The bottom dielectric layer 232 may include the additive of a first additive concentration, and the gate dielectric layer 260 may have a second additive concentration that is lower than the first additive concentration. In some embodiments, the bottom dielectric layer 232 may be a reflowed dielectric layer formed by a reflow process, and the gate dielectric layer 260 may be formed by an oxidation process or a deposition process. The reflowed dielectric layer of the bottom dielectric layer 232 may include an additive that lowers a glass transition temperature of the bottom dielectric layer 232 such that the bottom dielectric layer 232 including the additive will reflow at a temperature lower than the bottom dielectric layer 232 that is free of the additive. In some embodiments, the gate dielectric layer 260 may include impurities that may be different chemical elements from the additive of the bottom dielectric layer 232. The impurities of the gate dielectric layer 260 may be unintentionally included in the gate dielectric layer 260 during fabrication processes and may be, for example, carbon (C) and/or nitrogen (N). It will be appreciated that an impurity concentration of the gate dielectric layer 260 may be low enough not to affect the performance of the UMOSFET.

As shown in FIG. 3, a center portion of a top surface of the bottom dielectric layer 232 is curved. The gate dielectric layer 260 may be provided conformally on the bottom dielectric layer 232, the sidewalls of the trench 222, and upper surfaces of the source regions 250. A portion of the gate dielectric layer 260 that is on the center portion of the top surface of the bottom dielectric layer 232 may have curved upper and lower surfaces, and portions of the gate dielectric layer 260 that are on the upper corners of the trench 222 may likewise have curved surfaces. Each of the gate dielectric layer 260 and the bottom dielectric layer 232 may include a dielectric layer, and thus the gate dielectric layer 260 and the bottom dielectric layer 232 may be collectively referred to as a dielectric layer. As shown in FIG. 3, the dielectric layer may be in a lower portion of the trench 222, a center portion of a top surface of the dielectric layer may be curved, and the dielectric layer may be on opposed sidewalls of the trench 222.

Figure 3B:
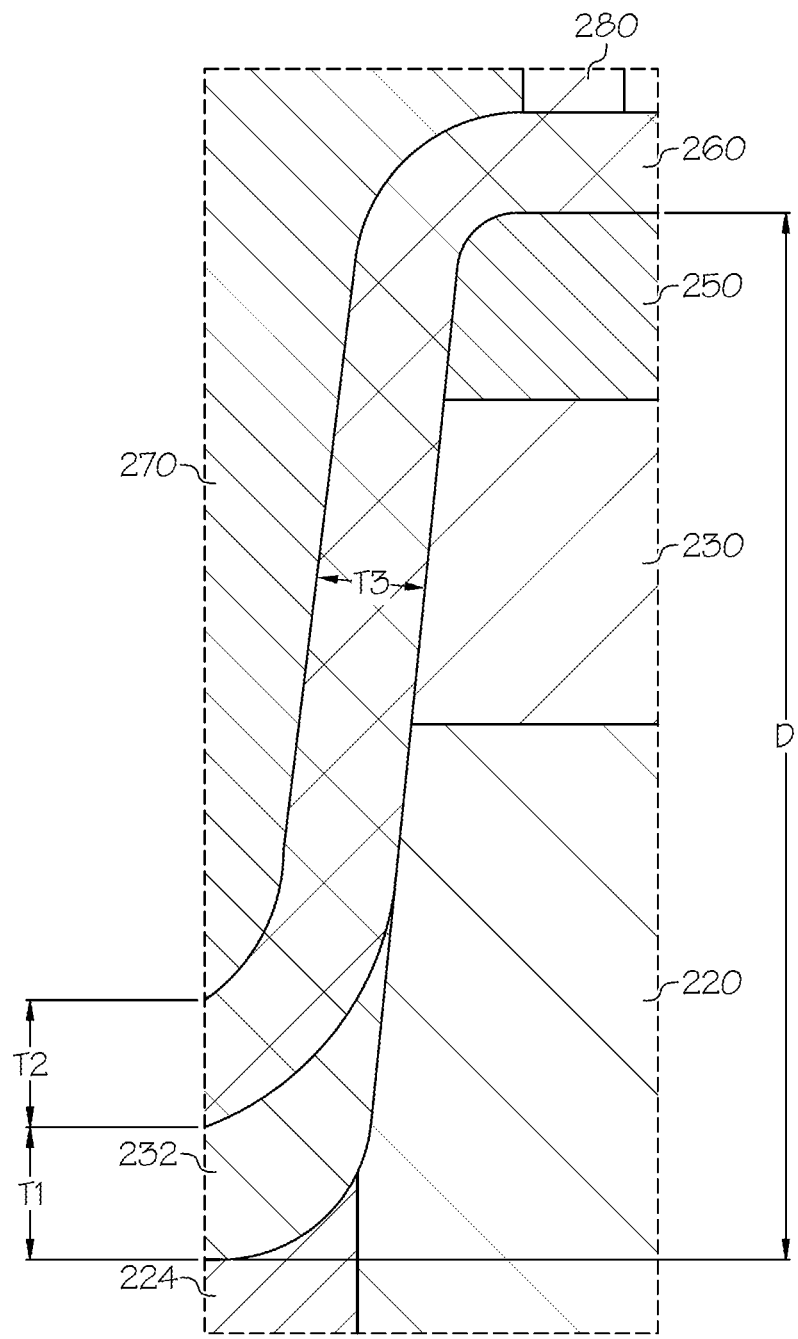
FIG. 3B is an enlarged view of the region C of FIG. 2.

FIG. 3B is an enlarged view of the region C of FIG. 3. As shown in FIG. 3B, a center portion of the bottom dielectric layer 232 has a first thickness T1 in a depth direction of the trench 222, the gate dielectric layer 260 includes a first portion that is on the bottom dielectric layer 232 and that has a second thickness T2 in the depth direction of the trench 222 and a second portion that is on the sidewall of the trench 222 and has a third thickness T3 in the width direction of the trench 222. In some embodiments, the sum of the first thickness T1 and the second thickness T2 may be greater than the third thickness T3. In such embodiments, the dielectric material in the trench 222 (i.e., the combination of the bottom dielectric layer 232 and the gate dielectric layer 260) may extend upwardly from the bottom surface of the trench 222 than it extends outwardly from the upper sidewalls of the trench 222.

For example, the first thickness T1 may be in a range of from 2 nanometers to 90 nanometers, the second thickness T2 may be in a range of from 5 nanometers to 90 nanometers, and the third thickness T3 may be in a range of from 10 nanometers to 90 nanometers. A depth D of the trench 222 may be at least 1.5 times the sum of the first thickness T1 and the second thickness T2. In some embodiments, the second thickness T2 may be within 10% of the third thickness T3. For example, the second thickness T2 may be identical or nearly identical to the third thickness T3. The first thickness T1 may be greater, equal to or less than the second thickness T2. In some embodiments, the sum of first thickness T1 and the second thickness T2 may be greater than the third thickness T3.

Referring to FIGS. 3 and 3B, in some embodiments, the top surface of the bottom dielectric layer 232 that has the curved surface may have a radius of curvature that is between 0.25 times the smaller of the width W and the depth D of the trench 222 and 3 times the larger of the width/depth of the trench 222. In other embodiments, that curvature may be between 0.5 times the smaller of the width/depth of the trench 222 and 2 times the larger of the width/depth of the trench 222 or between 0.75 times the smaller of the width/depth of the trench 222 and 1.5 times the larger of the width/depth of the trench 222. It will be appreciated that the curvature of the curved surface of the bottom dielectric layer 232 may not be necessarily constant, and only a portion of the central portion of the top surface of the bottom dielectric layer 232 may have the specified curvature. Moreover, while the top surface of the bottom dielectric layer 232 comprises a surface rather than a line, since the trench 222 typically has a uniform depth and width along its length direction, each transverse cross-section of the trench 222 may be substantially the same along the length direction of the trench 222. The center portion of the lower surface of the bottom dielectric layer 232 refers to the portion of the lower surface of the bottom dielectric layer 232 that extends in the width direction of the trench 222 from a center of the trench 222 to halfway to each of the sidewalls of the trench 222 (i.e., the portion in the center 50% of the trench 222).

The gate dielectric layer 260 may be provided conformally on the bottom dielectric layer 232, the sidewalls of the trench 222, and upper surfaces of the source regions 250. A portion of the gate dielectric layer 260 that is on the center portion of the top surface of the bottom dielectric layer 232 may have a uniform thickness and may have curved upper and lower surfaces that each have a radius of curvature that is the same as the radius of curvature of the curved surface of the bottom dielectric layer 232. In some example embodiments, the curved lower surface of the gate dielectric layer 260 may have a radius of curvature that is between 0.25 times the smaller of the width/depth of the trench 222 and 3 times the larger of the width/depth of the trench 222. In other embodiments, the curvature of the gate dielectric layer 260 may be between 0.5 times the smaller of the width/depth of the trench 222 and 2 times the larger of the width/depth of the trench 222 or between 0.75 times the smaller of the width/depth of the trench 222 and 1.5 times the larger of the width/depth of the trench 222. The center portion of the lower surface of the gate dielectric layer 260 refers to the portion of the lower surface of the gate dielectric layer 260 that extends in the width direction of the trench 222 from a center of the trench 222 to halfway to each of the sidewalls of the trench 222 (i.e., the portion in the center 50% of the trench 222).

Figure 4:
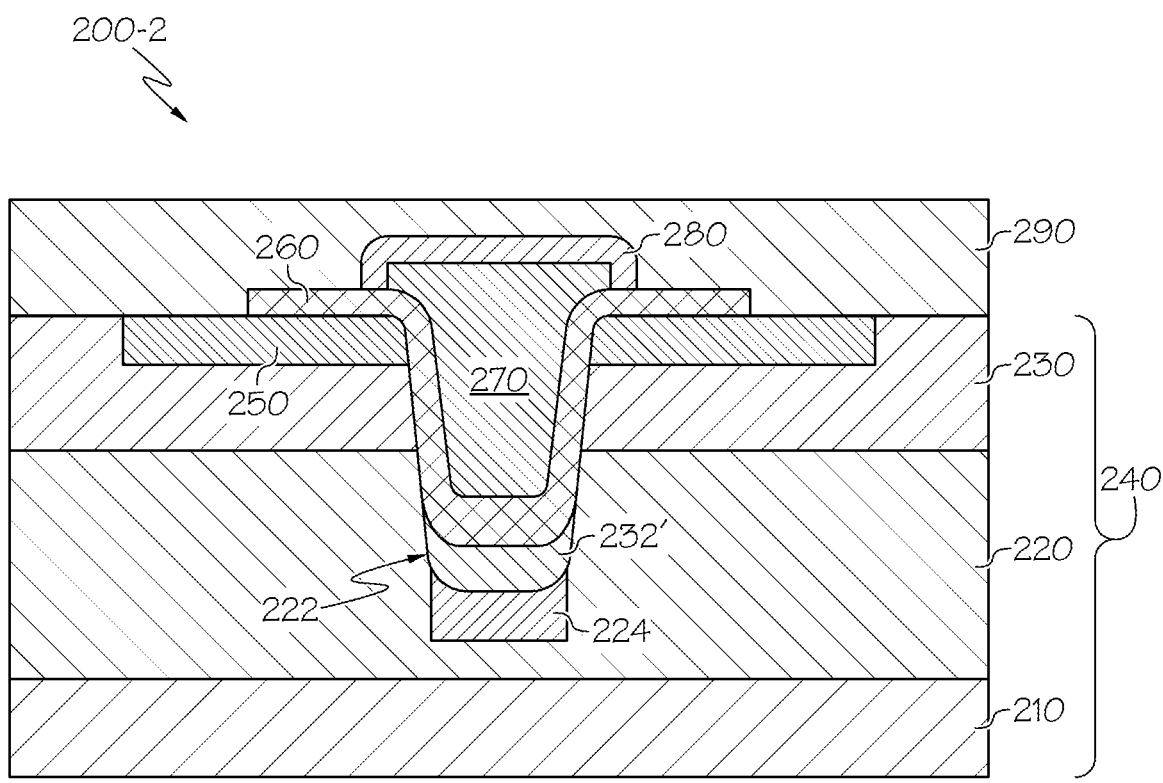
FIGS. 4-10 are schematic cross-sectional views of a power UMOSFET according to embodiments of the present invention.

FIG. 4 is a schematic cross-sectional view of a power UMOSFET 200-2 according to embodiments of the present invention. The UMOSFET 200-2 may be substantially identical to the power UMOSFET 200-1 of FIG. 3 except the shape of a bottom dielectric layer 232'. In some embodiments, the bottom dielectric layer 232' may have a flat top surface as illustrated in FIG. 4.

Figure 5:
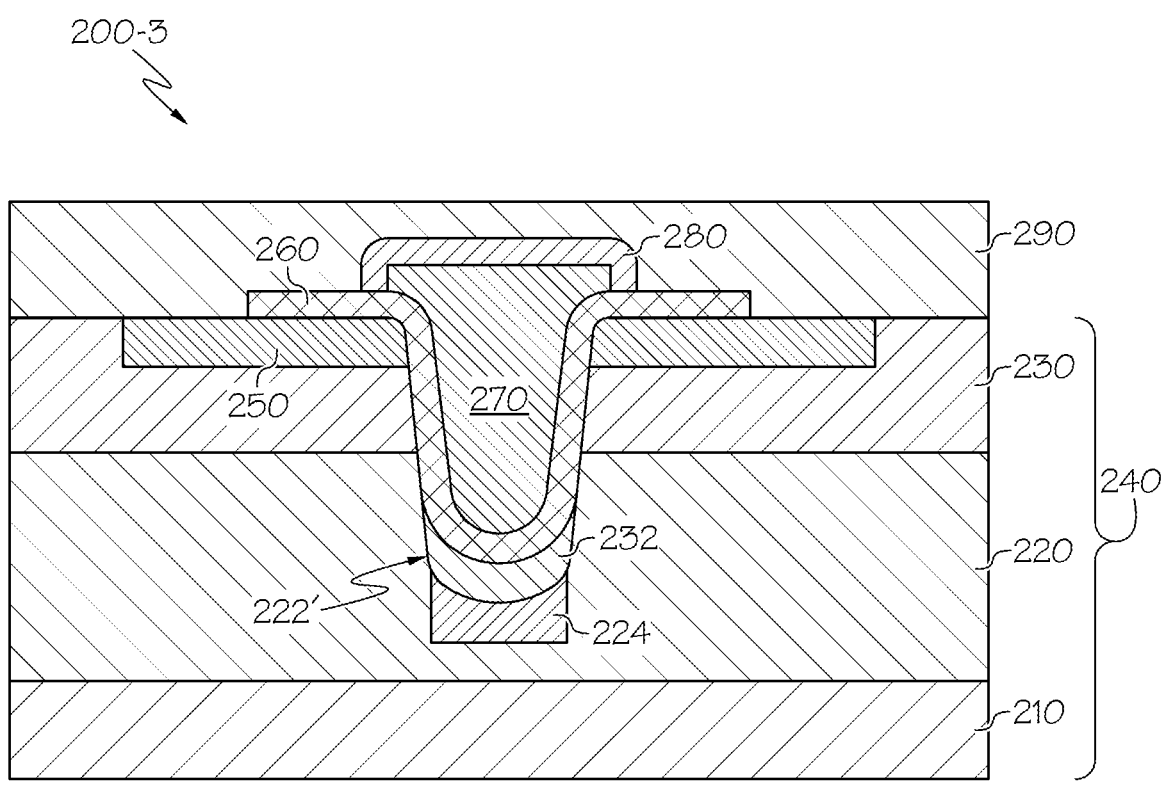

FIG. 5 is a schematic cross-sectional view of a power UMOSFET 200-3 according to embodiments of the present invention. The UMOSFET 200-3 may be substantially identical to the power UMOSFET 200-1 of FIG. 3 except the shape of the bottom surface of a trench 222'. A center portion of the bottom surface of the trench 222' may be curved as illustrated in FIG. 5.

Figure 6:
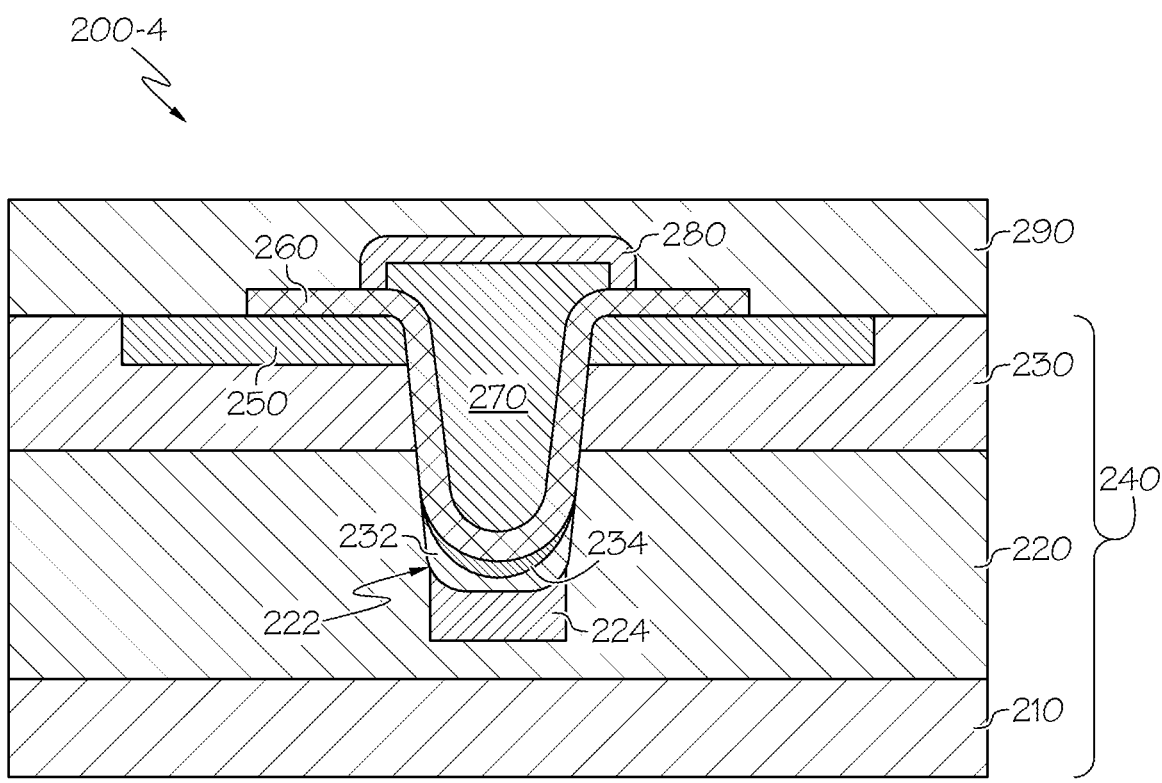

FIG. 6 is a schematic cross-sectional view of a power UMOSFET 200-4 according to embodiments of the present invention. The UMOSFET 200-4 may be substantially identical to the power UMOSFET 200-1 of FIG. 3 except for an additional barrier layer 234 provided between the bottom dielectric layer 232 and the gate dielectric layer 260. The barrier layer 234 may inhibit diffusion of elements (e.g., an impurities and/or additives) included in the bottom dielectric layer 232 to surrounding regions/layers (e.g., into the gate dielectric layer 260 and/or into the gate electrode 270). The barrier layer 234 may include a material different from the bottom dielectric layer 232. For example, the barrier layer 234 may include a silicon nitride layer and/or a silicon oxide layer. In some embodiments, the barrier layer 234 may not include and may be free from the impurities and/or additives included in the bottom dielectric layer 232.

The barrier layer 234 may be provided conformally on the bottom dielectric layer 232 and a center portion the barrier layer 234 may also be curved as illustrated in FIG. 6. In some embodiments, an uppermost end of the barrier layer 232 may be closer to the bottom surface of the trench 222 than a bottom surface of the portions of the p-wells 232 that form portions of the respective sidewalls of the trench 222. As such, only the gate dielectric layer 260 may be interposed between the channels (e.g., the channels 231 in FIG. 3) and the gate electrode 270.

Figure 7:
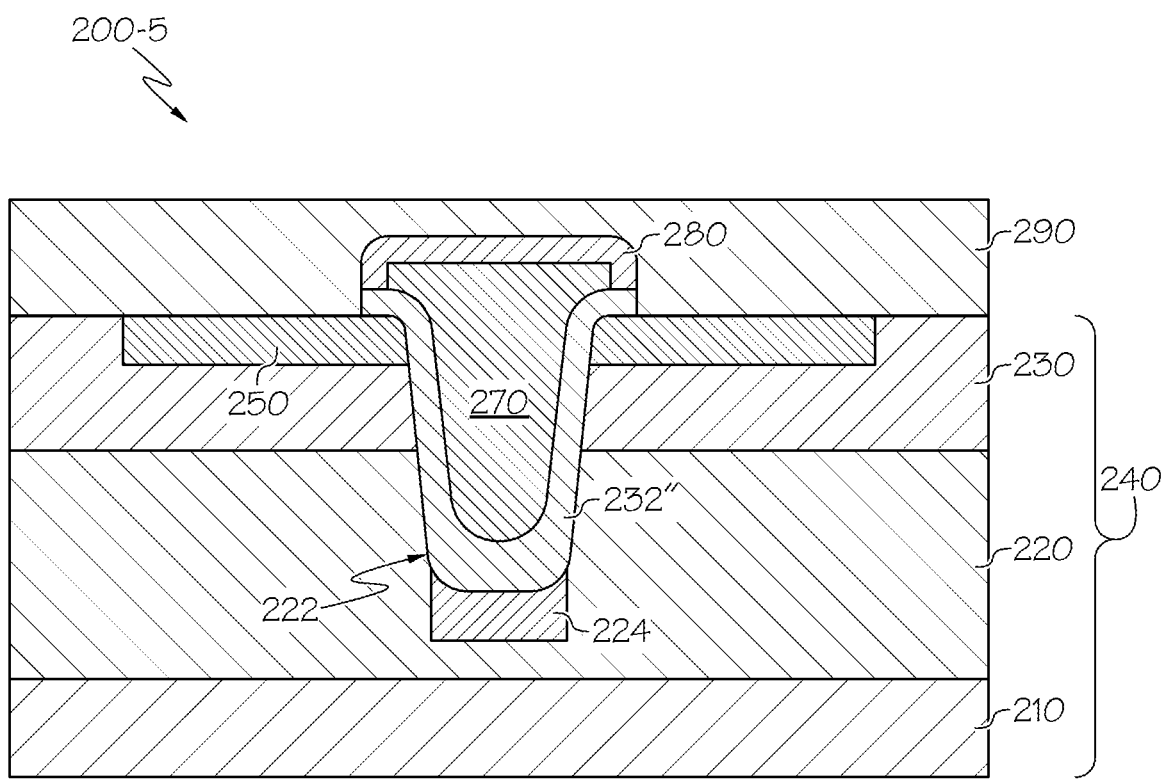

FIG. 7 is a schematic cross-sectional view of a power UMOSFET 200-5 according to embodiments of the present invention. The UMOSFET 200-5 may be substantially identical to the power UMOSFET 200-1 of FIG. 3 except that the power UMOSFET 200-5 does not include a separate gate dielectric layer (e.g., the gate dielectric layer 260). In the power UMOSFET 200-5, the bottom dielectric layer 232" may function as a gate dielectric layer. The bottom dielectric layer 232" may be a reflowed dielectric layer. The bottom dielectric layer 232" has a first thickness on the bottom surface of the trench 222 and a second thickness on the sidewall of the trench 222, and the first thickness may be thicker than the second thickness. The bottom dielectric layer 232" includes portions on the sidewalls of the trench 222, and thicknesses of those portions of the bottom dielectric layer 232" may increase with a depth of the trench 222 as illustrated in FIG. 6.

Figure 8:
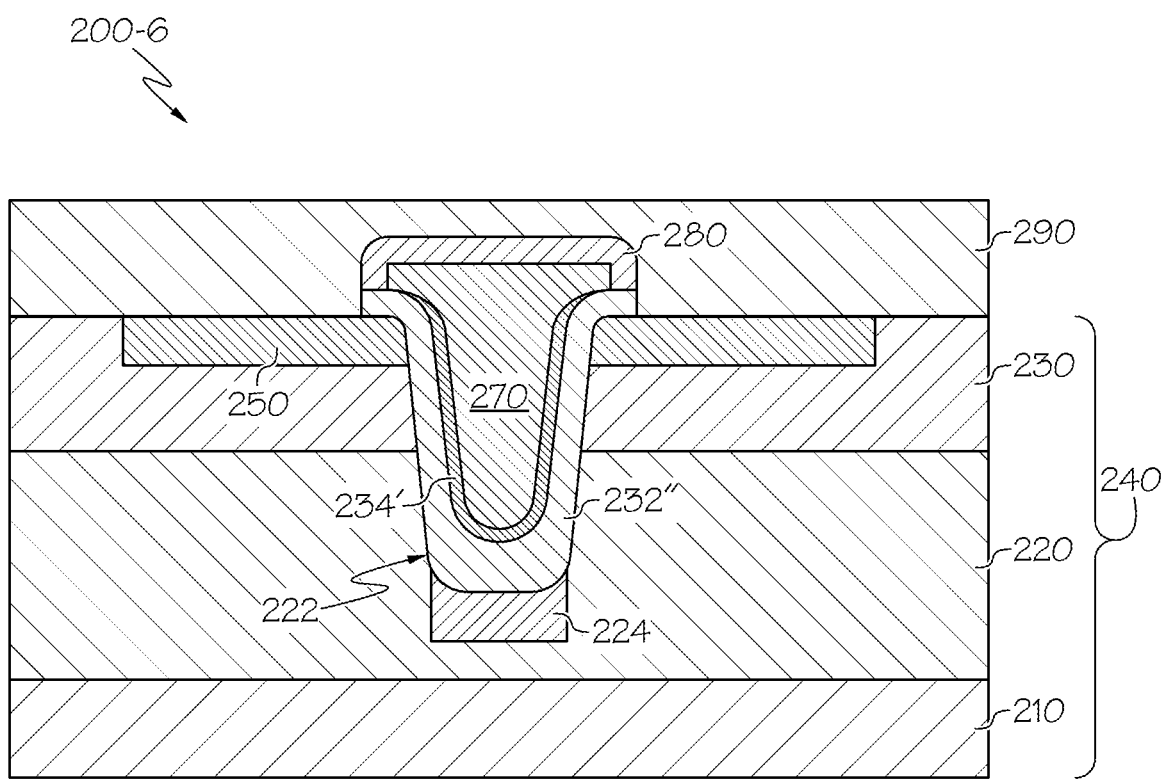

FIG. 8 is a schematic cross-sectional view of a power UMOSFET 200-6 according to embodiments of the present invention. The UMOSFET 200-6 may be substantially identical to the power UMOSFET 200-5 of FIG. 7 except for an additional barrier layer 234' provided between the bottom dielectric layer 232" and the gate electrode 270. As shown in FIG. 8, the barrier layer 234' may directly contact both the bottom dielectric layer 232" and the gate electrode 270.

Figure 9:
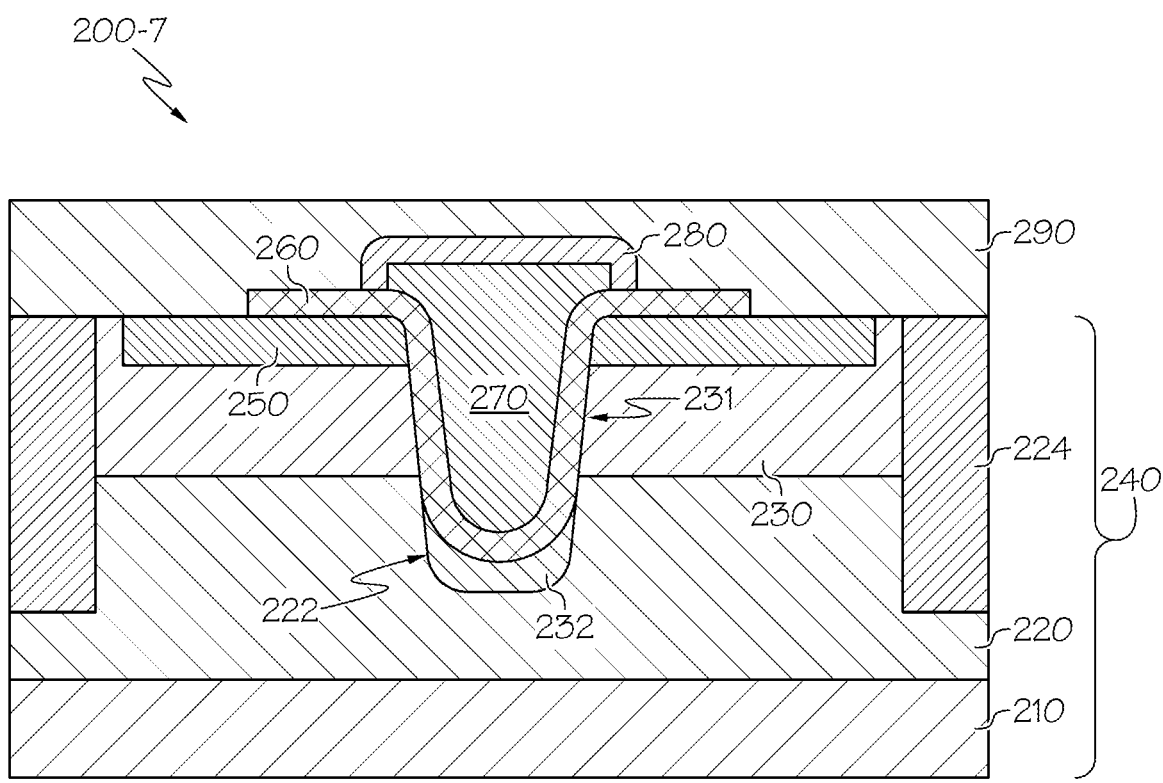

FIG. 9 is a schematic cross-sectional view of a power UMOSFET 200-7 according to embodiments of the present invention. The UMOSFET 200-7 may be substantially identical to the power UMOSFET 200-1 of FIG. 3 except that P-type shield regions 224 are formed in the drift layer 220 underneath the p-type wells 230 as opposed to being formed underneath the gate trench 222. It will be appreciated that the p-type shield regions 224 may be formed under the gate trenches 222, under the p-type wells 230, or underneath both, in each of the embodiments of the present invention disclosed herein.

Figure 10:
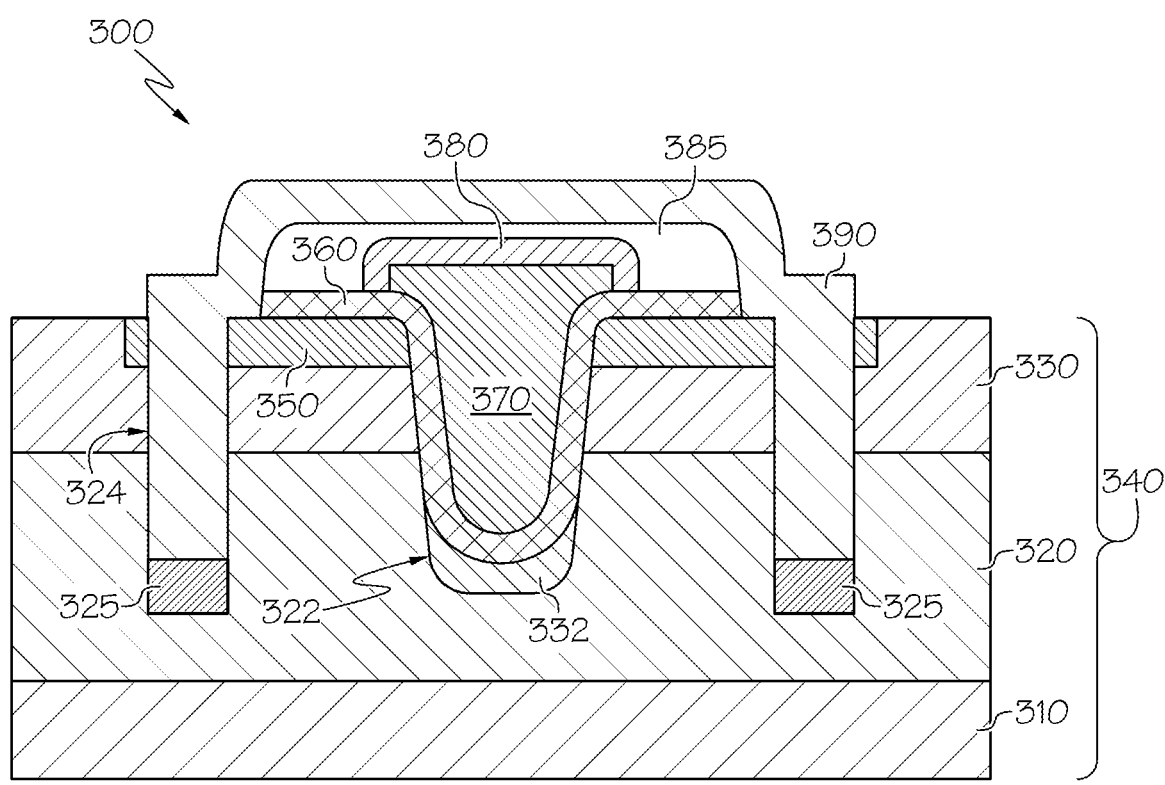

FIG. 10 is a schematic cross-sectional view of a power UMOSFET 300 according to embodiments of the present invention. The power UMOSFET 300 includes a semiconductor layer structure 340 that includes a heavily-doped n-type silicon carbide semiconductor substrate 310, a lightly-doped n-type (n−) silicon carbide drift layer 320, silicon carbide p-type wells 330 and heavily-doped (n+) n-type silicon carbide source regions 350. A trench 322 is provided in the drift layer 320. A bottom dielectric layer 332 may be provided in a lower portion of the trench 322, a gate dielectric layer 360 may be provided on a top surface of the bottom dielectric layer 332, sidewalls of the trench 322, and on the source regions 350. A gate electrode 370 is formed within the trench 322 on the gate dielectric layer 360 opposite the bottom dielectric layer 332. A dielectric isolation pattern 380 is formed on the gate dielectric layer 360 and the gate electrode 370. Upper corners of the trench 322 may be rounded corners such that the magnitude of electric field in portions of the gate dielectric layer 360 contacting the upper corners of the trench 322 may be reduced, and the lifetime of the gate dielectric layer 360 may increase.

Region/layers of the power UMOSFET 300 may be substantially identical to the corresponding regions/layers of the UMOSFET 200-1 of FIG. 3 except for additional source trenches 324 and a source metallization 390, portions of which are provided in respective source trenches 324 to form source contacts. The source trenches 324 may extend through the source region 350 and the silicon carbide p-type well 330 and a bottom surface of the source trenches 324 may be in the drift layer 320. An interlayer insulating layer 385 may be provided between the dielectric isolation pattern 380 and the source metallization 390. Deep shield regions 325 may be formed underneath each of the source trenches. The deep shield regions 325 are electrically connected to the p-type wells 330 so that they will act as shields that facilitate protecting the gate dielectric layer 360 during reverse blocking operation. In the depicted embodiment, these electrical connections are made outside the cross-section of the figure. It will be appreciated, however, that the deep shield regions 325 could alternatively be connected to the p-type wells 330 by deep shield connection patterns that would be visible in the cross-section of FIG. 10. For example, one or both of the sidewalls of the source trenches 324 may be implanted with p-type ions to form such deep shield connection patterns (not shown) in the cross-section of FIG. 10.

It will be appreciated that the UMOSFET 200-2 of FIG. 4, the UMOSFET 200-3 of FIG. 5, the UMOSFET 200-5 of FIG. 7, the UMOSFET 200-7 of FIG. 9, and the UMOSFET 300 of FIG. 10 may also include a barrier layer (e.g., the barrier layer 234 in FIG. 6) directly on a bottom dielectric layer (e.g., the bottom dielectric layer 232 in FIG. 9 or the bottom dielectric layer in 332 in FIG. 10).

Figure 11:
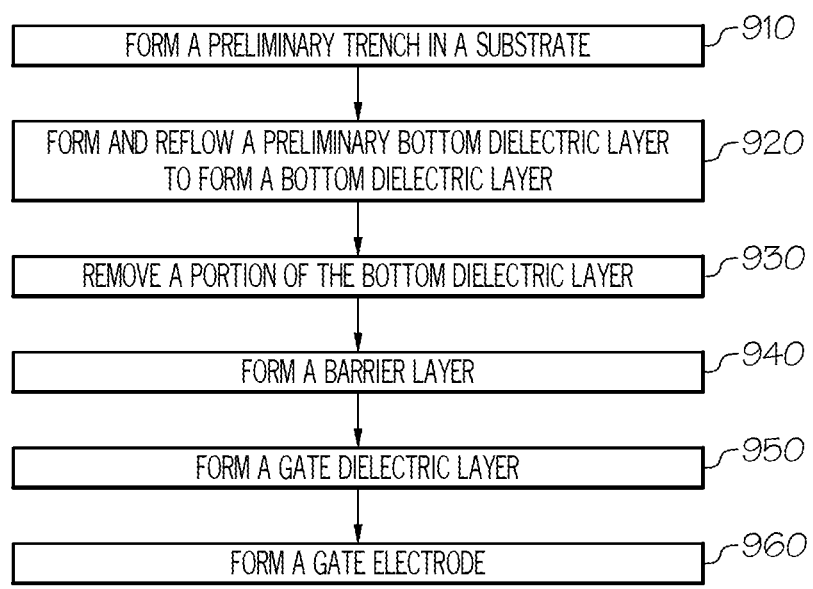
FIGS. 11-14 are flow charts illustrating methods of forming a power UMOSFET according to embodiments of the present invention.
Figure 12:
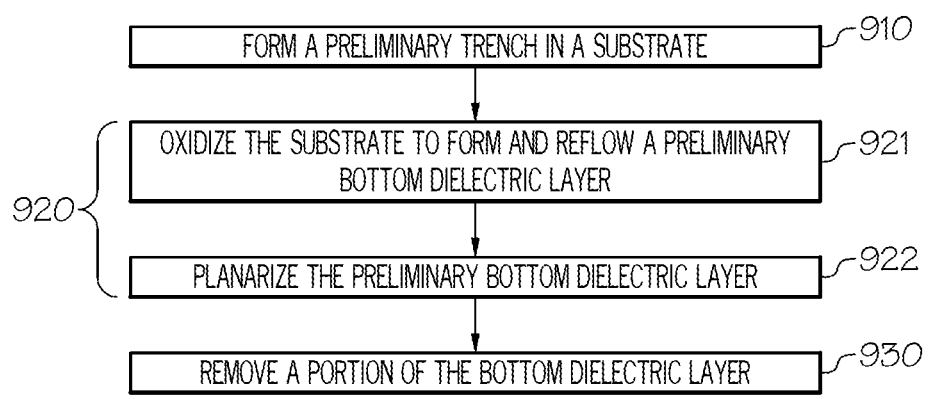
Figure 13:
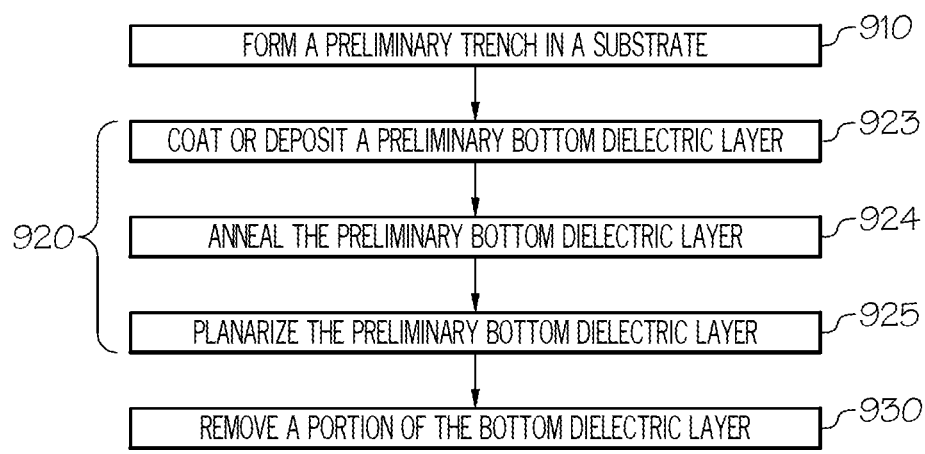
Figure 14:
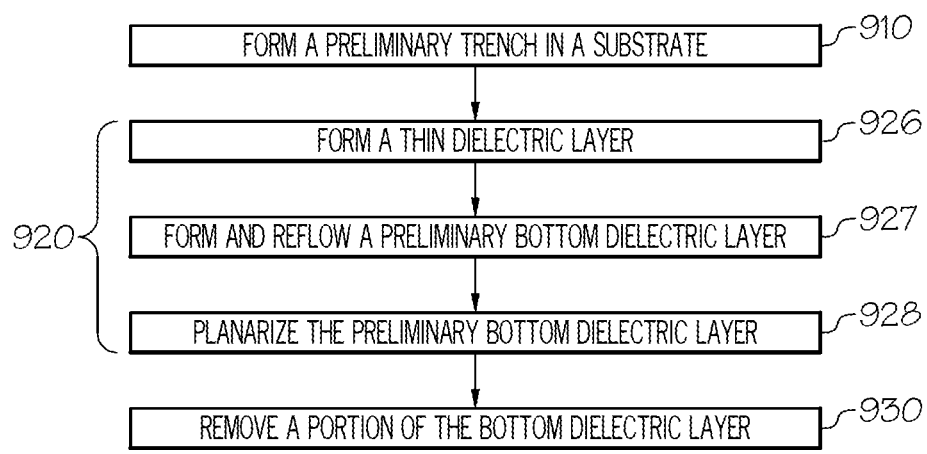

FIGS. 11-14 are flow charts illustrating methods of forming a power UMOSFET according to embodiments of the present invention. In particular, FIG. 11 illustrates general steps of a method of forming a power UMOSFET according to embodiments of the present invention, and FIGS. 12-14 illustrate several different ways of performing one of the steps of the method of FIG. 11, namely the step of forming a bottom dielectric layer (Block 920 in FIG. 11). FIGS. 15-18 are schematic cross-sectional views that illustrate various of the steps shown in the flow charts of FIGS. 11-14.

Figure 15:
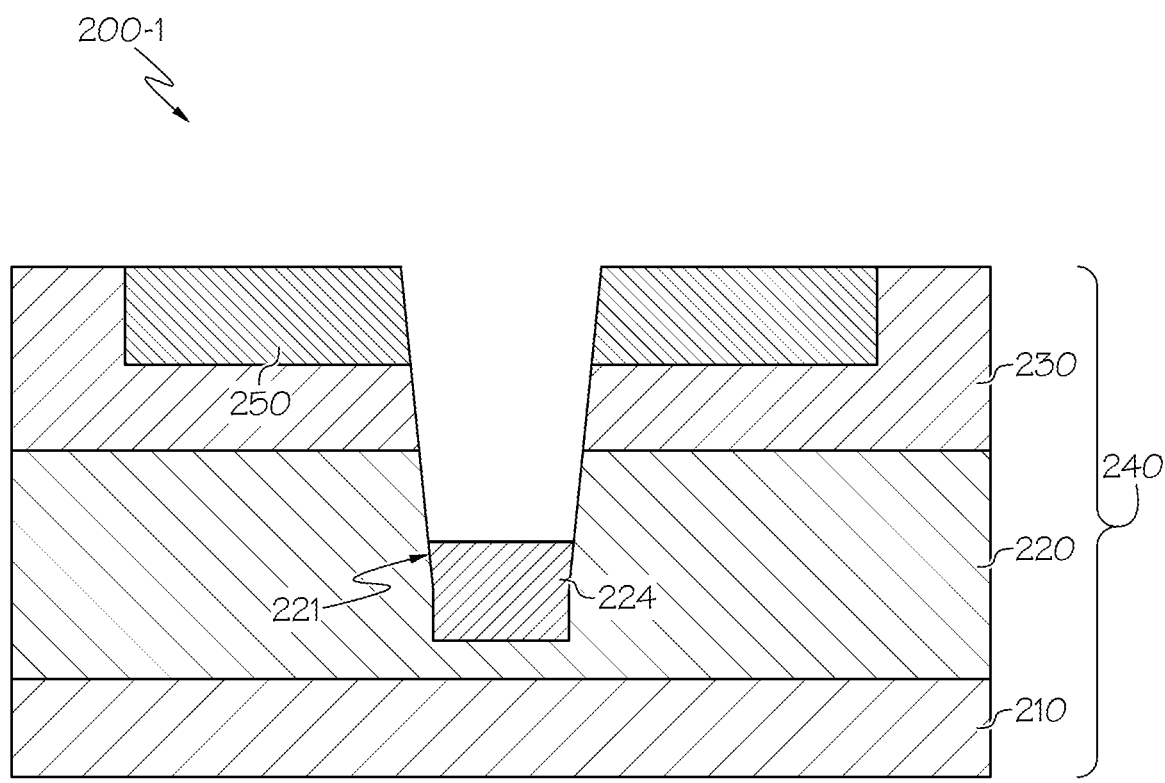
FIGS. 15-18 are schematic cross-sectional views of illustrating a method of forming a power UMOSFET according to embodiments of the present invention.

Referring FIGS. 11 and 15, the method may include forming a preliminary trench 221 (Block 910) in a substrate. The substrate herein may refer to a semiconductor layer structure 240 that includes a semiconductor substrate 210, a drift layer 220, a well 230, and a source region 250. The preliminary trench 221 may be formed after all layers/regions of the semiconductor layer structure 240 are formed.

In some embodiments, some layers/regions (e.g., the source region 250) of the semiconductor layer structure 240 and/or a shield region 224 may be formed after the preliminary trench 221 is formed. The preliminary trench 221 may be formed by an etch process, and the preliminary trench 221 may have sharp upper corners and sharp lower corners as illustrated in FIG. 15.

Figure 16:
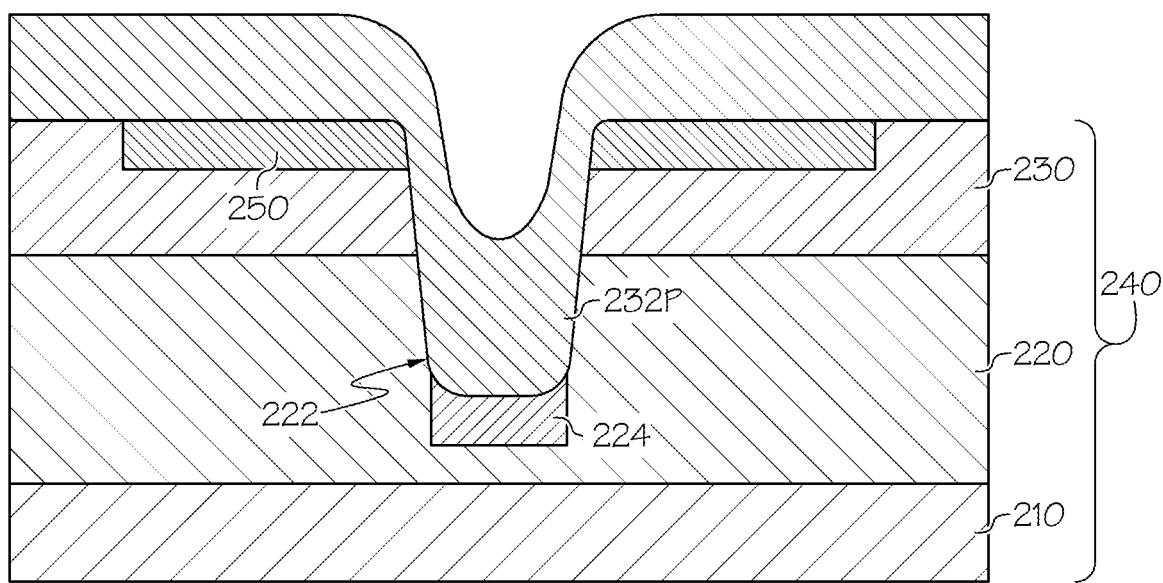

Referring FIGS. 11, 12, and 16, a preliminary bottom dielectric layer 232*p* may be formed after the preliminary trench 221 is formed by oxidizing the substrate (Block 921). Oxidizing the substrate converts exposed portions of the silicon carbide semiconductor layer structure 240 to silicon oxide, thereby forming a silicon oxide layer both in and on the exposed portions of the semiconductor layer structure 240 (as the silicon oxide "grows" into the semiconductor layer structure 240 and also grows outwardly from the semiconductor layer structure 240 based on the addition of the oxygen atoms). The oxidation is performed at temperatures that are sufficient to reflow the silicon oxide so that the preliminary bottom dielectric layer 232*p* may be formed and reflowed at the same time (Block 921). For example, the oxidation may be performed at a temperature no lower than about 900° C. for SiC oxidation if network modifier dopants are present, or up to a maximum of about 1550° C. for pure $O_2$ oxidation of SiC.

Oxidizing the substrate may be performed by a thermal oxidation using $O_2$, $O_3$, NO, $N_2O$ and/or $H_2O$ as oxidant, or performing a plasma oxidation using any of the aforementioned gases, or other oxidizers. Oxidizing the substrate may be performed at a temperature at least about a glass transition temperature of the preliminary bottom dielectric layer 232*p*, and the preliminary bottom dielectric layer 232*p* may be formed and reflow concurrently in some embodiments. The sharp upper corners and sharp lower corners of the preliminary trench 221 may be rounded by oxidation of portions of the source region 250 and the drift layer 220, thereby forming a trench 222. The preliminary bottom dielectric layer 232*p* may flow into the trench 222 by reflowing and a center portion of a top surface of the preliminary bottom dielectric layer 232*p* may be curved as illustrated in FIG. 16. The amount of dielectric material that flows into the preliminary trench 221 may be controlled by controlling the parameters of the oxidation process.

In some embodiments, oxidizing the substrate may be performed in an environment including a network modifier, and the preliminary bottom dielectric layer 232*p* may include the network modifier. The network modifier may be, for example, boron (B), phosphorous (P), sodium (Na), potassium (K), lithium (Li), calcium (Ca), magnesium (Mg), and/or lead (Pb). The network modifier lowers a glass-transition temperature of the preliminary bottom dielectric layer 232*p*, and the preliminary bottom dielectric layer 232*p* can reflow at a temperature lower than a glass-transition temperature of the preliminary bottom dielectric layer 232*p* that is free of the network modifier. The preliminary bottom dielectric layer 232*p* may include the network modifier in an amount of less than 4% by weight of the preliminary bottom dielectric layer 232*p*. For example, the preliminary bottom dielectric layer 232*p* may include the network modifier in an amount of from 1% to 2% by weight of the preliminary bottom dielectric layer 232*p*.

Figure 17:
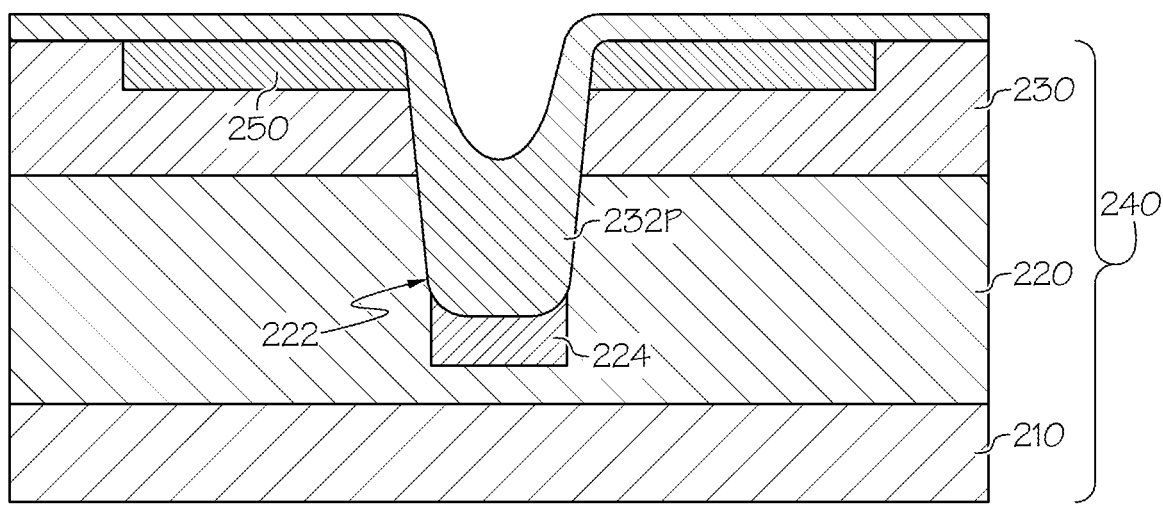

Referring to FIGS. 12 and 17, the preliminary bottom dielectric layer 232*p* may optionally be planarized (Block 922) using a chemical-mechanical polish (CMP) process or an etch process. Although FIG. 17 shows that planarizing the preliminary bottom dielectric layer 232*p* leaves a portion of the preliminary bottom dielectric layer 232*p* an upper surface of the source region 250, in some embodiments, the planarization process may be performed until the upper surface of the source region 250 is exposed.

Figure 18:
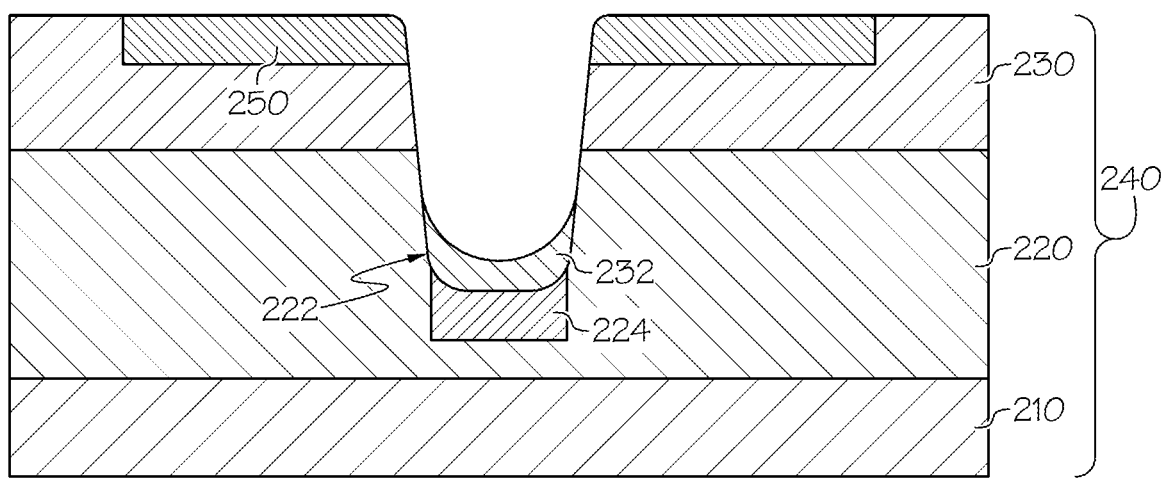

Referring to FIGS. 11 and 18, a portion of the preliminary bottom dielectric layer 232p may be removed (Block 930), thereby forming a bottom dielectric layer 232 in a lower portion of the trench 222. The portion of the preliminary bottom dielectric layer 232p may be removed by an etch process. The preliminary bottom dielectric layer 232p may be etched while maintaining a profile of an upper surface of the preliminary bottom dielectric layer 232p so that the bottom dielectric layer 232 may have a top surface, a center portion of which is curved.

Referring to FIGS. 6 and 11, a barrier layer 234 may be formed on the bottom dielectric layer 232 (Block 940). The barrier layer 234 may contact the top surface of the bottom dielectric layer 232. The barrier layer 234 may be formed, for example, by forming the barrier layer 234 conformally on the underlying structure (e.g., the well 230 and the source region 250) and then isotropically etching the barrier layer 234. In some embodiments, forming the barrier layer 234 may be omitted. In some embodiments, the barrier layer 234 may be deposited in an anisotropic (directional) fashion, such that sidewall portions of the barrier layer 234 (i.e., portions of the barrier layer 234 formed on sidewalls of the trench 222) may be thinner than a bottom portion of the barrier layer 223 (i.e., a portion of the barrier layer 234 formed on the bottom surface of the trench 222), thereby helping allow the isotropic etch to remove the sidewall portions of the barrier layer 234 before the bottom portion of the barrier layer 234 is removed. Further, the method may include sequentially forming a gate dielectric layer 260 (Block 950) and a gate electrode 270 (Block 960).

Figure 19:
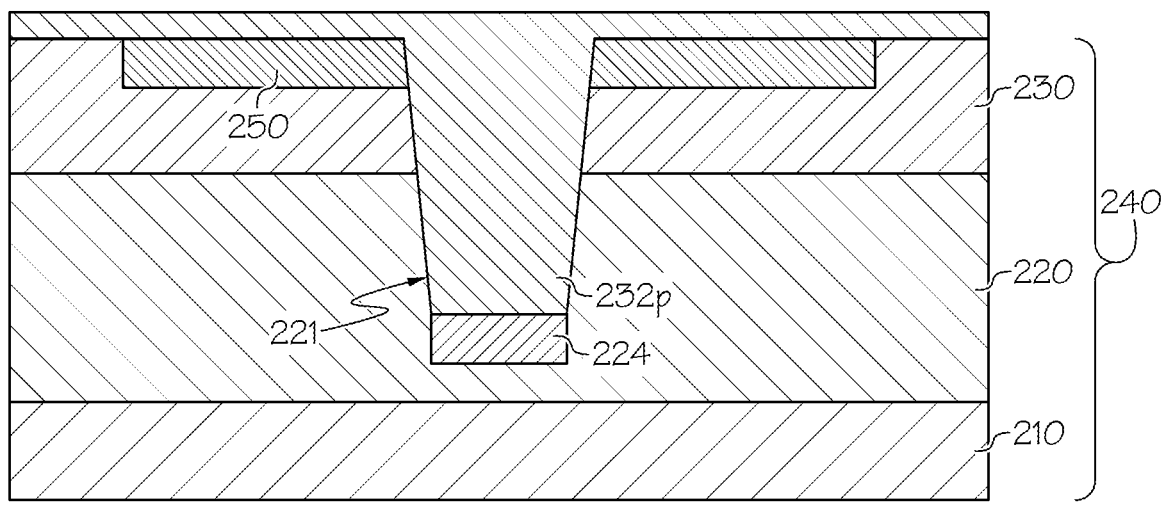
FIGS. 19-21 are schematic cross-sectional views of illustrating a method of forming a power UMOSFET according to embodiments of the present invention.
Figure 20:
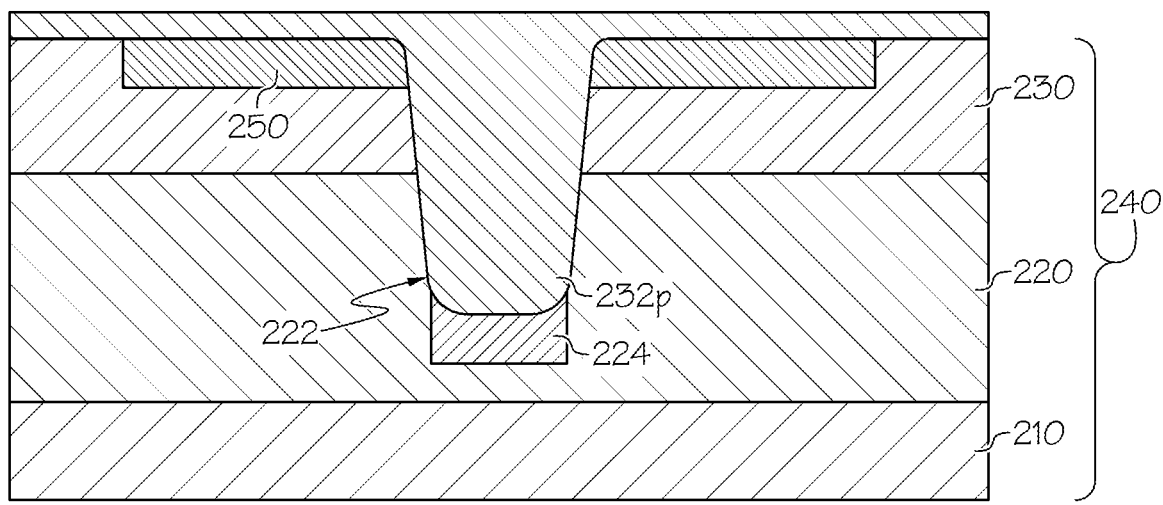
Figure 21:
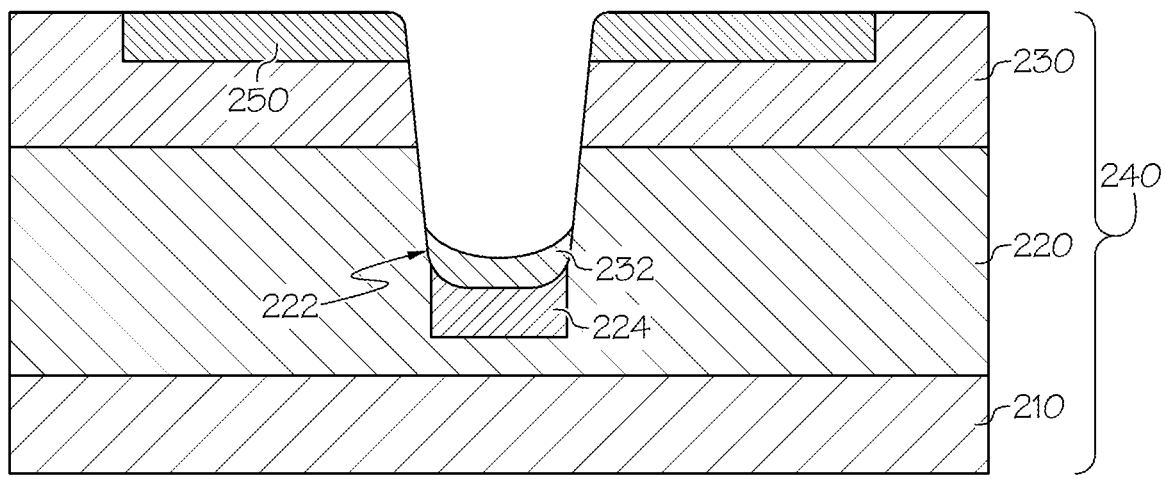
Figure 22:
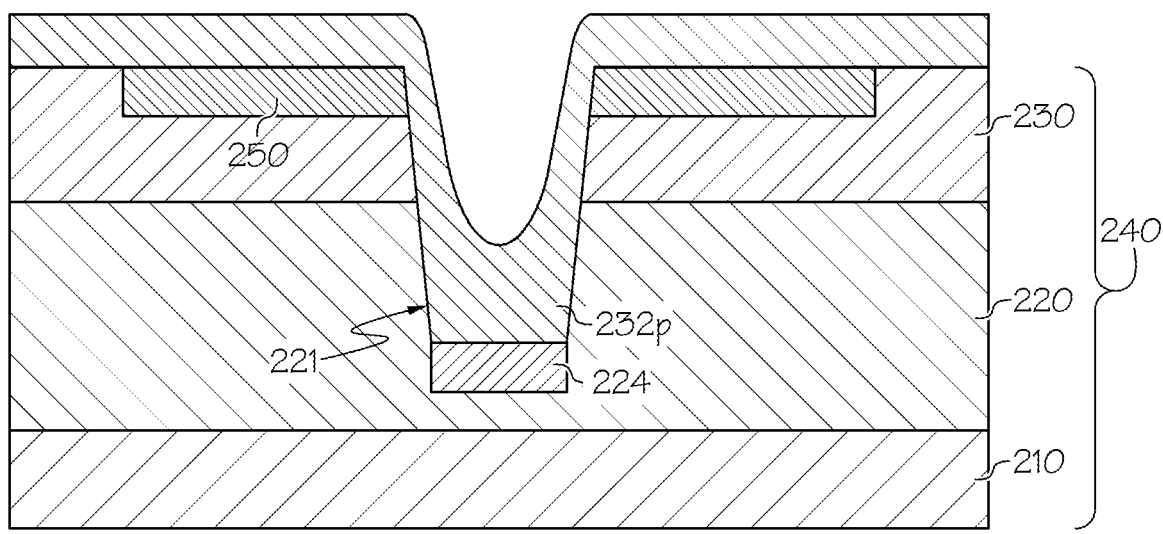
FIGS. 22 and 23 are schematic cross-sectional views of illustrating a method of forming a power UMOSFET according to embodiments of the present invention.

FIGS. 19-21 and FIGS. 22 and 23 are schematic cross-sectional views of illustrating methods of forming a power UMOSFET according to further embodiments of the present invention. Referring to FIGS. 13, 19, and 22, forming the bottom dielectric layer 232 (Block 920) may include coating or depositing a preliminary bottom dielectric layer 232p (Block 923) in the preliminary trench 221. Coating the preliminary bottom dielectric layer 232p may be coating a spin-on-glass layer that may fill the preliminary trench 221 and may have a flat upper surface as shown in FIG. 19. The preliminary bottom dielectric layer 232p formed by a deposition process may not fill the preliminary trench 221 as shown in FIG. 22. As shown in FIGS. 19 and 22, coating or depositing the preliminary bottom dielectric layer 232p may not change a shape of the preliminary trench, and thus the preliminary trench 221 include sharp upper corners and lower corners. Coating or depositing the preliminary bottom dielectric layer 232p may be coating a spin-on-glass layer or depositing preliminary bottom dielectric layer 232p, such as silicon oxide layer using, for example, a chemical vapor deposition (CVD) process. The spin-on-glass layer may include boron (B), phosphorous (P), sodium (Na), potassium (K), lithium (Li), calcium (Ca), magnesium (Mg), and/or lead (Pb).

Figure 23:
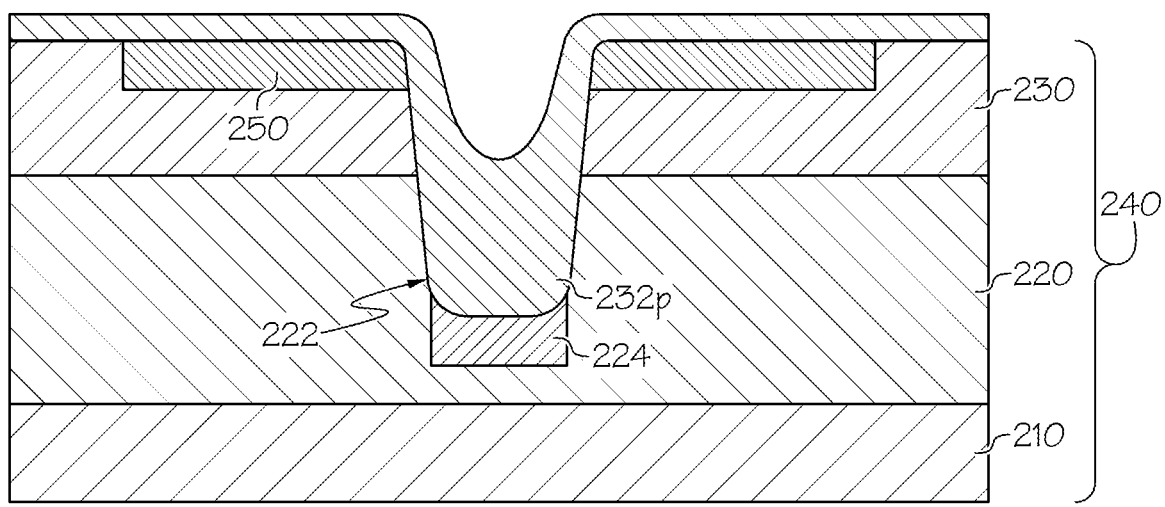

Referring to FIGS. 13, 20, and 23, forming the bottom dielectric layer 232 (Block 920) may also include annealing the preliminary bottom dielectric layer 232p (Block 924) in an environment including an oxidant at a temperature at least about a glass transition temperature of the preliminary bottom dielectric layer 232p. As annealing is performed in the environment including the oxidant, the substrate may be oxidized and the trench 222 having rounded upper corners and rounded lower corners is formed during annealing. Further, as annealing is performed at a temperature at least about a glass transition temperature of the preliminary bottom dielectric layer 232p, the preliminary bottom dielectric layer 232p may reflow during annealing and flow into the trench 222. Referring to FIG. 20, when the preliminary bottom dielectric layer 232p is formed by the coating process shown in FIG. 19, the annealing process may not change the shape of the preliminary bottom dielectric layer 232p. Referring to FIG. 23, when the preliminary bottom dielectric layer 232p is formed by the deposition process shown in FIG. 22, the preliminary bottom dielectric layer 232p may flow into the trench 222, and an upper surface of the preliminary bottom dielectric layer 232p may become less curved.

Forming the bottom dielectric layer 232 (Block 920) may optionally further include planarizing the preliminary bottom dielectric layer 232p (Block 925). It will be appreciated that planarizing the preliminary bottom dielectric layer 232p may be performed before or after annealing the preliminary bottom dielectric layer 232p (Block 924).

Referring to FIGS. 13 and 21, a portion of the bottom dielectric layer 232 that includes the spin-on-glass layer of FIG. 20 may be removed (Block 930) by, for example, an etch back process. After the portion of the bottom dielectric layer 232 is removed, a top surface of the bottom dielectric layer 232 may have a small curvature as shown in FIG. 21 with the lowest portion in the middle thereof.

Figure 24:
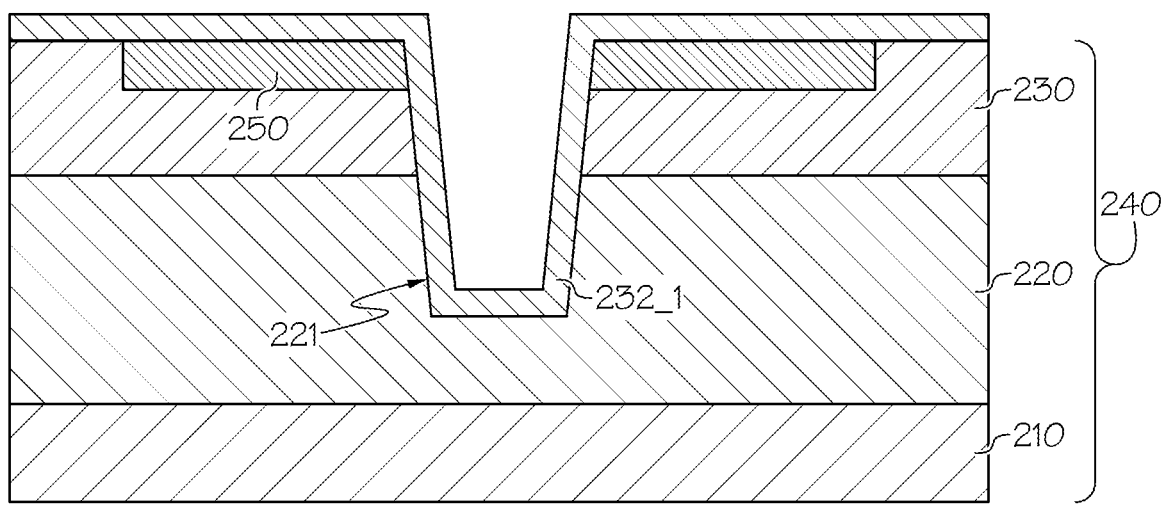
FIGS. 24-26 are schematic cross-sectional views of illustrating a method of forming a power UMOSFET according to embodiments of the present invention.
Figure 25:
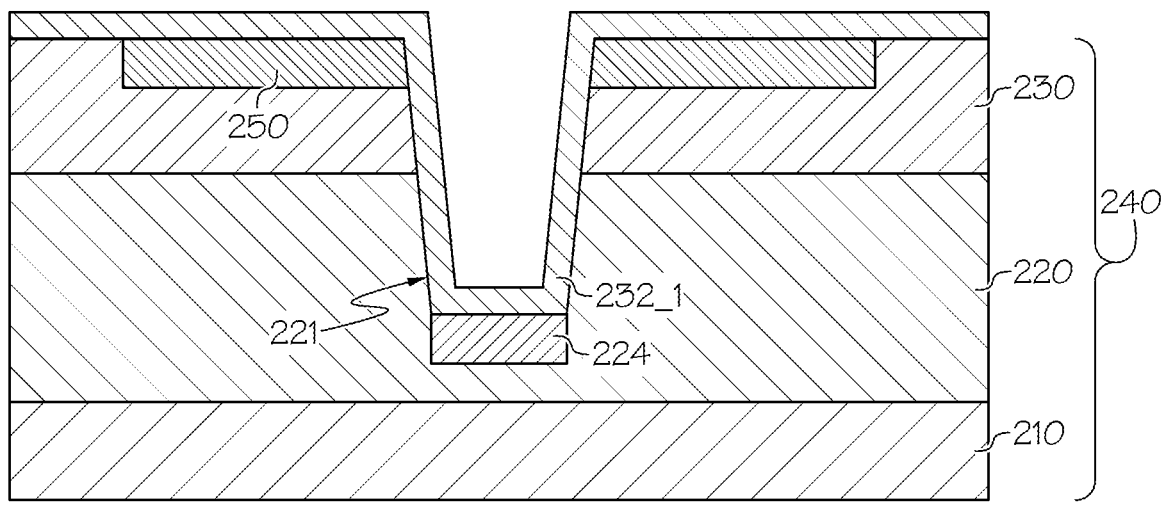
Figure 26:
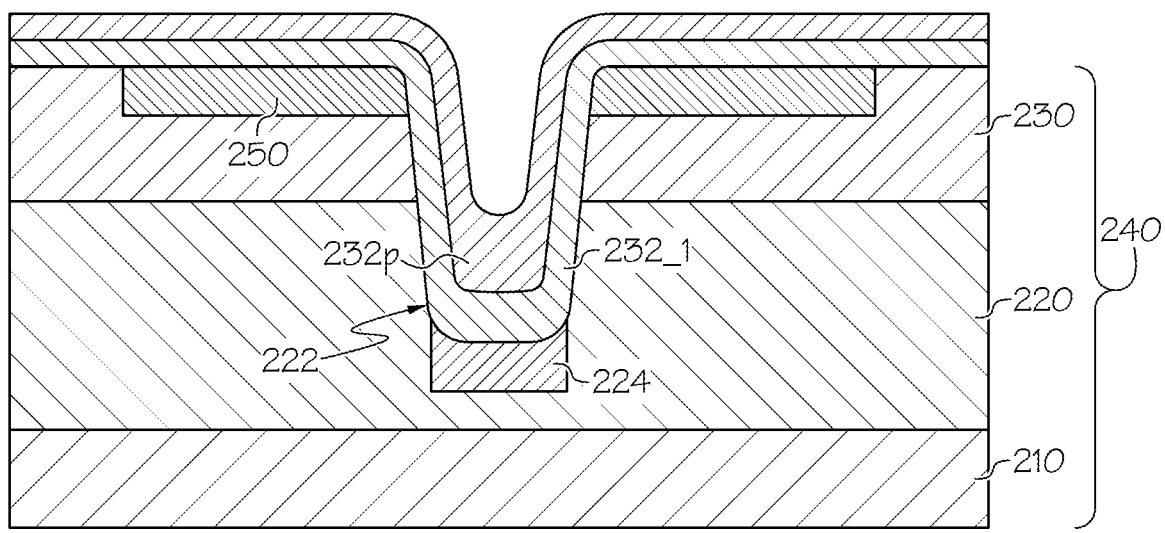

FIGS. 24-26 are schematic cross-sectional views of illustrating a method of forming a power UMOSFET according to embodiments of the present invention. Referring to FIGS. 14 and 24, the method may include forming a thin dielectric layer 232_1 (Block 926) after a preliminary trench 221 is formed. The thin dielectric layer 232_1 may be formed conformally on the underlying structure as illustrated in FIG. 24. The thin dielectric layer 232_1 may be formed by coating using conformal coating techniques such as atomic layer deposition (ALD) or depositing a dielectric layer using other approaches. The underlying structure may not include P-type shield regions (e.g., the P-type shield regions 224 in FIG. 3). Referring to FIG. 25, P-type shield regions 224 may be formed after the thin dielectric layer 232_1 is formed. The P-type shield regions 224 may be formed by implanting impurities into portions of the drift layer 220 through the thin dielectric layer 232_1.

Referring to FIGS. 14 and 26, the method may also include forming and reflowing a preliminary bottom dielectric layer 232p (Block 927). Forming and reflowing the preliminary bottom dielectric layer 232p may be performed concurrently by an oxidation process similar to the processes discussed with reference to FIG. 12 or may be sequentially performed by processes similar to the processes discussed with reference to FIG. 13. Thereafter, planarizing the preliminary bottom dielectric layer 232p may be performed (Block 928). Remaining processes (e.g., Blocks 930-960 of FIG. 11) may be performed.

Figure 27:
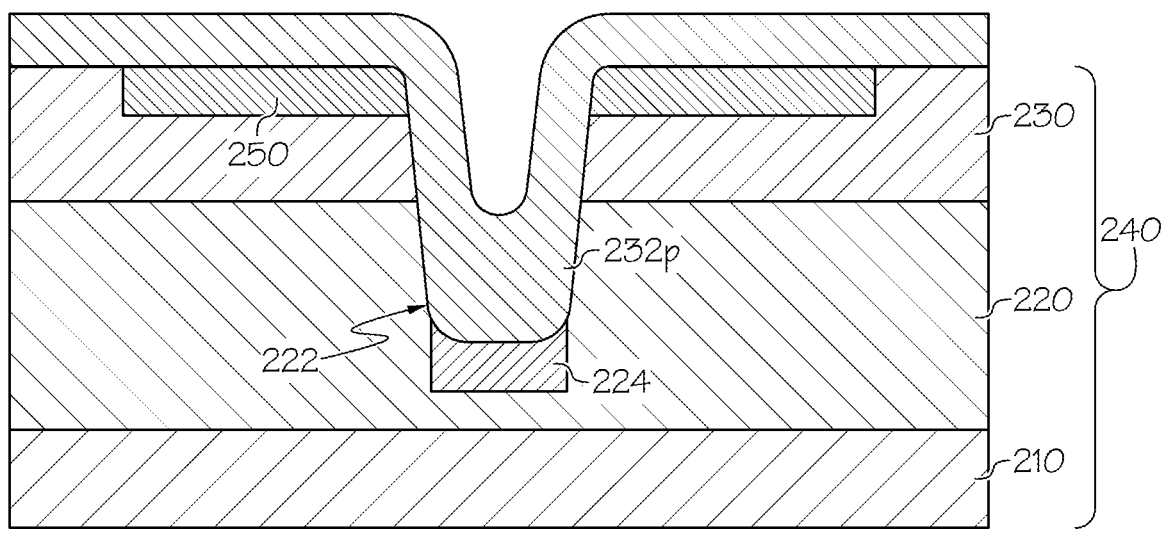
FIGS. 27 and 28 are schematic cross-sectional views of illustrating a method of forming a power UMOSFET according to embodiments of the present invention.
Figure 28:
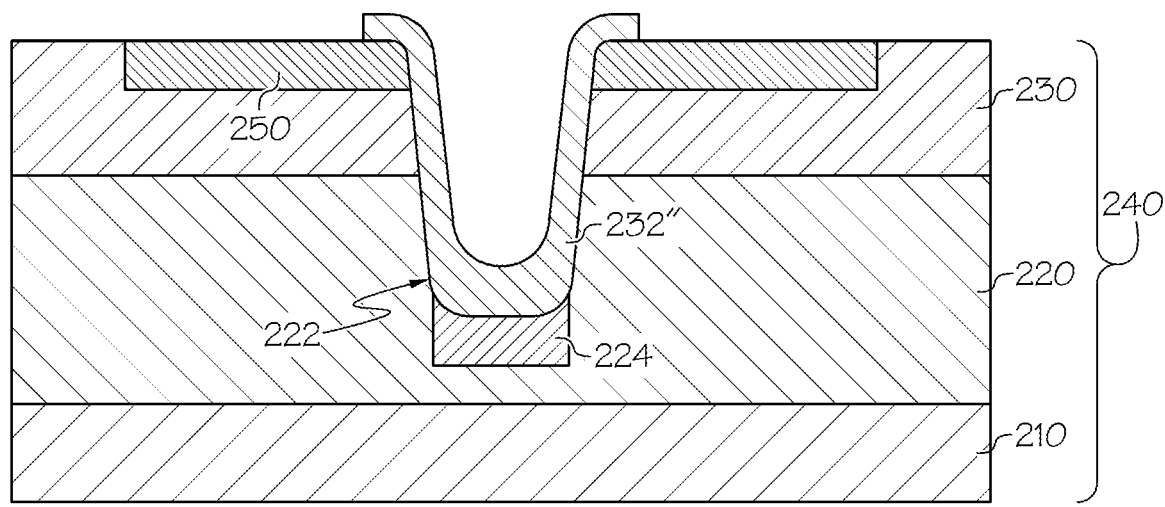

FIGS. 27 and 28 are schematic cross-sectional views illustrating a method of forming a power UMOSFET according to embodiments of the present invention. Referring to FIG. 27, a preliminary bottom dielectric layer 232p may be formed by processes discussed above, and then the preliminary bottom dielectric layer 232p may be patterned to form a bottom dielectric layer 232" as shown in FIG. 28. Referring back to FIG. 7, a gate electrode 270 may be formed directly on the bottom dielectric layer 232", and the bottom dielectric layer 232" may be used as a gate dielectric layer of the device.

The present disclosure describes an approach to improve interface protection in metal-oxide (or insulator)-semiconductor (MOS or MIS) devices. This may be particularly useful for improving the gate regions in a power transistor (e.g., a MOSFET, MISFET, or an IGBT).

While various of the embodiments discussed above illustrate the structure of a unit cell of an n-channel MOSFET, it will be appreciated that pursuant to further embodiments of the present invention, the polarity of each of the semiconductor layers in each device could be reversed so as to provide corresponding p-channel MOSFETs.

The invention has been described above with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. It will be understood that when an element or layer is referred to as being "on," "connected to," or "coupled to" another element or layer, it can be directly on, connected or coupled to the other element or layer, or intervening elements or layers may be present. In contrast, when an element is referred to as being "directly on," "directly connected to," or "directly coupled to" another element or layer, there are no intervening elements or layers present. As used herein, the term "and/or" includes any and all combinations of one or more of the associated listed items. Like numbers refer to like elements throughout.

It will be understood that although the terms first and second are used herein to describe various regions, layers and/or elements, these regions, layers and/or elements should not be limited by these terms. These terms are only used to distinguish one region, layer or element from another region, layer or element. Thus, a first region, layer or element discussed below could be termed a second region, layer or element, and similarly, a second region, layer or element may be termed a first region, layer or element without departing from the scope of the present invention.

Relative terms, such as "lower" or "bottom" and "upper" or "top," may be used herein to describe one element's relationship to another element as illustrated in the drawings. It will be understood that relative terms are intended to encompass different orientations of the device in addition to the orientation depicted in the drawings. For example, if the device in the drawings is turned over, elements described as being on the "lower" side of other elements would then be oriented on "upper" sides of the other elements. The exemplary term "lower" can, therefore, encompass both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, elements, and/or components, but do not preclude the presence or addition of one or more other features, elements, components, and/or groups thereof.

Embodiments of the invention are described herein with reference to cross-sectional illustrations that are schematic illustrations. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Thus, the regions illustrated in the figures are schematic in nature and their shapes are not intended to illustrate the actual shape of a region of a device and are not intended to limit the scope of the invention.

It will be understood that the embodiments disclosed herein can be combined. Thus, features that are pictured and/or described with respect to a first embodiment may likewise be included in a second embodiment, and vice versa.

While the above embodiments are described with reference to particular figures, it is to be understood that some embodiments of the present invention may include additional and/or intervening layers, structures, or elements, and/or particular layers, structures, or elements may be deleted. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

That which is claimed is:

1. A semiconductor device comprising:
    a semiconductor layer structure comprising a trench in an upper surface thereof, wherein the trench comprises a rounded upper corner and a rounded lower corner;
    a dielectric layer in a lower portion of the trench, wherein a center portion of a top surface of the dielectric layer is curved, and the dielectric layer is on opposed sidewalls of the trench; and
    a gate electrode in the trench and on the dielectric layer opposite the semiconductor layer structure,
    wherein the dielectric layer comprises:
        a bottom dielectric layer on a bottom surface of the trench and on lower portions of the sidewalls of the trench, the bottom dielectric layer comprising a rounded lower corner; and
        a gate dielectric layer on upper portions of the sidewalls of the trench and on the bottom dielectric layer.

2. The semiconductor device of claim 1, wherein the center portion of the top surface of the dielectric layer that is curved is a center portion of a top surface of the gate dielectric layer.

3. The semiconductor device of claim 2, wherein a center portion of a lower surface of the gate dielectric layer is curved.

4. The semiconductor device of claim 1, wherein the bottom dielectric layer comprises an additive comprising boron (B), phosphorous (P), sodium (Na), potassium (K), lithium (Li), calcium (Ca), magnesium (Mg), and/or lead (Pb).

5. The semiconductor device of claim 1, further comprising a barrier layer between the bottom dielectric layer and the gate dielectric layer.

6. The semiconductor device of claim 5, wherein the semiconductor layer structure comprises a drift layer having a first conductivity type, a well having a second conductivity type in an upper portion of the drift layer and a source region having the first conductivity type in an upper portion of the well, and wherein an uppermost end of the barrier layer is closer to the bottom surface of the trench than a bottom surface of the well.

7. The semiconductor device of claim 5, wherein the barrier layer comprises a silicon nitride layer and/or a silicon oxide layer.

8. The semiconductor device of claim 1, wherein the bottom dielectric layer is a reflowed dielectric layer.

9. The semiconductor device of claim 1, wherein the bottom dielectric layer comprises a spin-on-glass material.

10. The semiconductor device of claim 1, wherein the semiconductor layer structure comprises 4H-silicon carbide, and a top surface of the semiconductor layer structure comprises the (0001) face of the 4H-silicon carbide.

11. The semiconductor device of claim 1, wherein a center portion of a bottom surface of the trench is curved.

12. The semiconductor device of claim 1, wherein an opening of the trench has a first width, and a bottom surface of the trench has a second width that is narrower than the first width.

13. A semiconductor device comprising:
a semiconductor layer structure comprising a trench in an upper surface thereof, wherein the trench comprises a rounded upper corner and a rounded lower corner;
a dielectric layer in a lower portion of the trench, wherein a center portion of a top surface of the dielectric layer is curved, and the dielectric layer is on opposed sidewalls of the trench; and
a gate electrode in the trench and on the dielectric layer opposite the semiconductor layer structure),
wherein each of the rounded upper corner and the rounded lower corner has a radius of curvature in a range of 0.01 microns to 0.5 microns.

14. The semiconductor device of claim 13, wherein the dielectric layer comprises:
a bottom dielectric layer on a bottom surface of the trench and on lower portions of the sidewalls of the trench; and
a gate dielectric layer on upper portions of the sidewalls of the trench and on the bottom dielectric layer.

15. A semiconductor device comprising:
a semiconductor layer structure comprising a trench in an upper surface thereof, wherein the trench comprises a rounded upper corner and a rounded lower corner;
a bottom dielectric layer in a lower portion of the trench;
a gate dielectric layer on a sidewall of the trench and on the bottom dielectric layer; and
a gate electrode in the trench and on the gate dielectric layer opposite the semiconductor layer structure,
wherein the bottom dielectric layer comprises a first concentration of an additive, and the gate dielectric layer has a second concentration of the additive that is lower than the first concentration.

16. The semiconductor device of claim 15, wherein the additive comprises boron (B), phosphorous (P), sodium (Na), potassium (K), lithium (Li), calcium (Ca), magnesium (Mg), and/or lead (Pb).

17. The semiconductor device of claim 15, further comprising a barrier layer between the bottom dielectric layer and the gate dielectric layer.

18. The semiconductor device of claim 17, wherein the barrier layer comprises a silicon nitride layer and/or a silicon oxide layer.

19. A semiconductor device comprising:
a semiconductor layer structure comprising a trench in an upper surface thereof, wherein the trench comprises a rounded upper corner and a rounded lower corner;
a bottom dielectric layer in a lower portion of the trench;
a gate dielectric layer on a sidewall of the trench and on the bottom dielectric layer, the gate dielectric layer comprising a material different from the bottom dielectric layer; and
a gate electrode in the trench and on the gate dielectric layer opposite the semiconductor layer structure,
wherein the bottom dielectric layer comprises an additive, and the additive comprises boron (B), phosphorous (P), sodium (Na), potassium (K), lithium (Li), calcium (Ca), magnesium (Mg), and/or lead (Pb).

20. The semiconductor device of claim 19, wherein the bottom dielectric layer comprises a first concentration of the additive, and the gate dielectric layer has a second concentration of the additive that is lower than the first concentration.

21. A semiconductor device comprising:
a semiconductor layer structure comprising a trench in an upper surface thereof, wherein the trench comprises a rounded lower corner;
a dielectric layer in a lower portion of the trench, wherein a center portion of a top surface of the dielectric layer is curved; and
a gate electrode in the trench and on the dielectric layer opposite the semiconductor layer structure,
wherein the semiconductor layer structure comprises a drift layer having a first conductivity type, a well having a second conductivity type in an upper portion of the drift layer and a source region having the first conductivity type in an upper portion of the well, and
wherein the dielectric layer comprises:
a bottom dielectric layer on a bottom surface of the trench and on lower portions of sidewalls of the trench, the bottom dielectric layer comprising a rounded lower corner; and
a gate dielectric layer on upper portions of the sidewalls of the trench and on the bottom dielectric layer.

22. The semiconductor device of claim 21, wherein the lower portion of the trench is in the drift layer.

23. The semiconductor device of claim 22, wherein the bottom dielectric layer comprises an additive comprising boron (B), phosphorous (P), sodium (Na), potassium (K), lithium (Li), calcium (Ca), magnesium (Mg), and/or lead (Pb).

24. The semiconductor device of claim 21,
wherein the center portion of the top surface of the dielectric layer that is curved is a center portion of a top surface of the gate dielectric layer.

* * * * *

UNITED STATES PATENT AND TRADEMARK OFFICE
CERTIFICATE OF CORRECTION

| | |
|---|---|
| PATENT NO. | : 11,640,990 B2 |
| APPLICATION NO. | : 17/080956 |
| DATED | : May 2, 2023 |
| INVENTOR(S) | : Lichtenwalner et al. |

It is certified that error appears in the above-identified patent and that said Letters Patent is hereby corrected as shown below:

In the Claims

Column 21, Line 43, Claim 13: Please correct "structure)," to read --structure,--

Signed and Sealed this
Eleventh Day of July, 2023

Katherine Kelly Vidal

Katherine Kelly Vidal
*Director of the United States Patent and Trademark Office*